US012751002B2

(12) United States Patent
Chang et al.

(10) Patent No.: US 12,751,002 B2
(45) Date of Patent: Sep. 29, 2026

(54) SEMICONDUCTOR DEVICE COMPRISING TRENCH GATE ALONG WITH SEPARATION LAYERS

(71) Applicant: Samsung Electronics Co., Ltd., Suwon-si (KR)

(72) Inventors: Jihoon Chang, Suwon-si (KR); Sooho Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 388 days.

(21) Appl. No.: 18/493,267

(22) Filed: Oct. 24, 2023

(65) Prior Publication Data

US 2024/0397706 A1 Nov. 28, 2024

(30) Foreign Application Priority Data

May 24, 2023 (KR) ........................ 10-2023-0067196

(51) Int. Cl.
*H10B 12/00* (2023.01)

(52) U.S. Cl.
CPC ........... *H10B 12/482* (2023.02); *H10B 12/02* (2023.02); *H10B 12/315* (2023.02); *H10B 12/34* (2023.02); *H10B 12/485* (2023.02)

(58) Field of Classification Search
CPC .. H10B 12/0335; H10B 12/02; H10B 12/315; H10B 12/482; H10B 12/485; H10B 12/34; H10B 12/053
USPC .................. 257/296; 438/238, 239, 386, 399
See application file for complete search history.

(56) References Cited

U.S. PATENT DOCUMENTS

| | | | |
|---|---|---|---|
| 7,053,004 | B2 | 5/2006 | Shimada |
| 7,192,863 | B2 | 3/2007 | Zhijian et al. |
| 9,012,321 | B1 | 4/2015 | Kim et al. |
| 9,093,304 | B2 | 7/2015 | Koldiaev et al. |
| 9,384,984 | B2 | 7/2016 | Lin et al. |
| 9,735,016 | B2 | 8/2017 | Cho |

(Continued)

FOREIGN PATENT DOCUMENTS

| | | | |
|---|---|---|---|
| KR | 10-2016-0058499 | A | 5/2016 |
| KR | 102038091 | B1 | 10/2019 |
| KR | 102271600 | B1 | 7/2021 |

OTHER PUBLICATIONS

European Search Report dated Sep. 10, 2024 issued in European Patent Application No. 24153374.4-1211.

*Primary Examiner* — Didarul A Mazumder
(74) *Attorney, Agent, or Firm* — Harness, Dickey & Pierce, P.L.C.

(57) ABSTRACT

A semiconductor device including a word line intersecting and overlapping an active region and extending in a first direction, a word line capping layer on the word line, bit lines interacting and overlapping the active region and extending in a second direction, buried contacts each connected to the active region, direct contacts each connecting the active region to a corresponding one of the bit lines, a fence pattern on top of the word line capping layer, and a landing pad connected to a corresponding one of the buried contacts, wherein the fence pattern is within a fence pattern trench at a corresponding space between a corresponding pair the bit lines and between a corresponding pair the buried contacts, the fence pattern includes a first fence pattern and a second fence pattern on the first fence pattern that include different materials from each other may be provided.

20 Claims, 30 Drawing Sheets

(56) References Cited

U.S. PATENT DOCUMENTS

| | | | | |
|---|---|---|---|---|
| 10,361,208 | B2 | 7/2019 | Cho | |
| 10,593,690 | B2 | 3/2020 | Lu et al. | |
| 10,923,491 | B2 | 2/2021 | Lu et al. | |
| 11,527,547 | B2 | 12/2022 | Lu et al. | |
| 2005/0255695 | A1 | 11/2005 | Shimada | |
| 2006/0024956 | A1 | 2/2006 | Zhijian et al. | |
| 2014/0103414 | A1 | 4/2014 | Koldiaev et al. | |
| 2015/0061041 | A1 | 3/2015 | Lin et al. | |
| 2015/0099344 | A1 | 4/2015 | Kim et al. | |
| 2016/0141181 | A1 | 5/2016 | Cho | |
| 2017/0301676 | A1 | 10/2017 | Cho | |
| 2019/0057974 | A1 | 2/2019 | Lu et al. | |
| 2019/0244961 | A1 | 8/2019 | Cho | |
| 2020/0295025 | A1 | 9/2020 | Lu et al. | |
| 2021/0118473 | A1 | 4/2021 | Seong et al. | |
| 2021/0134826 | A1 | 5/2021 | Lu et al. | |
| 2021/0335790 | A1* | 10/2021 | Song | H10B 12/315 |
| 2022/0139927 | A1* | 5/2022 | Chang | H10B 12/315 257/296 |
| 2022/0189967 | A1* | 6/2022 | Kim | H10B 12/34 |
| 2022/0262803 | A1* | 8/2022 | Jang | H10B 12/053 |
| 2023/0044856 | A1 | 2/2023 | Park et al. | |
| 2023/0087468 | A1 | 3/2023 | Lu et al. | |

* cited by examiner

SEMICONDUCTOR DEVICE COMPRISING TRENCH GATE ALONG WITH SEPARATION LAYERS

CROSS-REFERENCE TO RELATED APPLICATION

This application claims priority to and the benefit of Korean Patent Application No. 10-2023-0067196 filed in the Korean Intellectual Property Office on May 24, 2023, the entire contents of which are incorporated herein by reference.

BACKGROUND

1. Field

The present disclosure relates to semiconductor devices.

2. Description of the Related Art

A semiconductor is a material belonging to an intermediate region between a conductor and a nonconductor, and refers to a material that conducts electricity under certain conditions. Various semiconductor devices (e.g., memory devices) can be manufactured by using a semiconductor material. Such semiconductor devices may be used in various electronic devices.

With the trend of miniaturization and high integration of electronic devices, it is necessary to form patterns that make up semiconductor devices finely. As the widths of such micro-patterns gradually decreases, the process difficulty increases, and parasitic capacitance, which degrades the operational performance of semiconductor devices, may increase.

SUMMARY

The present disclosure provide semiconductor devices with improved reliability and productivity.

According to an example embodiment, a semiconductor device includes a substrate including an active region between device separation layers, a word line intersecting and overlapping the active region, a word line capping layer covering a top surface of the word line, a plurality of bit lines interacting and overlapping the active region and extending in a different direction from an extension direction of the word line, a plurality of buried contacts each connected to the active region, direct contacts each connecting the active region to a corresponding one of the plurality of bit lines, a fence pattern on top of the word line capping layer above, and a landing pad connected to a corresponding one of the plurality of buried contacts, wherein the fence pattern is within a fence pattern trench, the fence pattern trench being at a corresponding space between the plurality of bit lines and between the plurality of buried contacts, a top surface of the word line capping layer is recessed along a bottom surface of the fence pattern trench, the fence pattern includes a first fence pattern, and a second fence pattern located on the first fence pattern, the first fence pattern includes a first material, and the second fence pattern includes a second material different from the first material.

According to an example embodiment, a semiconductor device includes a substrate including an active region between device separation layers, a word line intersecting and overlapping the active region, a word line capping layer covering a top surface of the word line, a plurality of bit lines interacting and overlapping the active region and extending in a different direction from an extension direction of the word line, a plurality of buried contacts each connected to the active region, a plurality of direct contacts each connecting the active region to a corresponding one of the plurality of bit lines, a fence pattern on top of the word line capping layer, and a landing pad connected to a corresponding one of the plurality of buried contacts, wherein the fence pattern is within a fence pattern trench, the fence pattern trench being at a corresponding space between the plurality of bit lines and between the plurality of buried contacts, a top surface of the word line capping layer is recessed along a bottom surface of the fence pattern trench, the fence pattern includes a first fence pattern, a second fence pattern, and a third fence pattern stacked sequentially within the fence pattern trench, the first fence pattern and the third fence pattern include a first material, the second fence pattern includes a second material having different permittivity from the first material, and at least one of a length of the first fence pattern, a length of the second fence pattern, and a length of the third fence pattern is a different.

According to an example embodiment, a semiconductor device includes a substrate including an active region between device separation layers, a word line intersecting and overlapping the active region, a word line capping layer covering a top surface of the word line, a plurality of bit lines interacting and overlapping the active region and extending in a different direction from an extension direction of the word line, a plurality of buried contacts each connected to the active region, a plurality of direct contacts each connecting the active region to a corresponding one of the plurality of bit lines, a fence pattern on top of the word line capping layer, and a landing pad connected to a corresponding one of the plurality of buried contacts, wherein the fence pattern is within a fence pattern trench, the fence pattern trench biene at a corresponding space between the plurality of bit lines and between the plurality of buried contacts, a top surface of the word line capping layer is recessed along a bottom surface of the fence pattern trench, each of the plurality of bit lines includes a first conductive layer, a second conductive layer, and a third conductive layer stacked sequentially, the fence pattern includes a first fence pattern, a second fence pattern, and a third fence pattern, at least one of the first fence pattern, the second fence pattern, and the third fence pattern includes a different material, and at least one of a width of the first fence pattern, a width of the second fence pattern, and a width of the third fence pattern is different.

According to some example embodiments, a parasitic capacitance between the micropatterns configuring the semiconductor device may be reduced by forming a fence pattern including multiple layers, which includes different materials, between the micropatterns.

DETAILED DESCRIPTION

Figure 1:
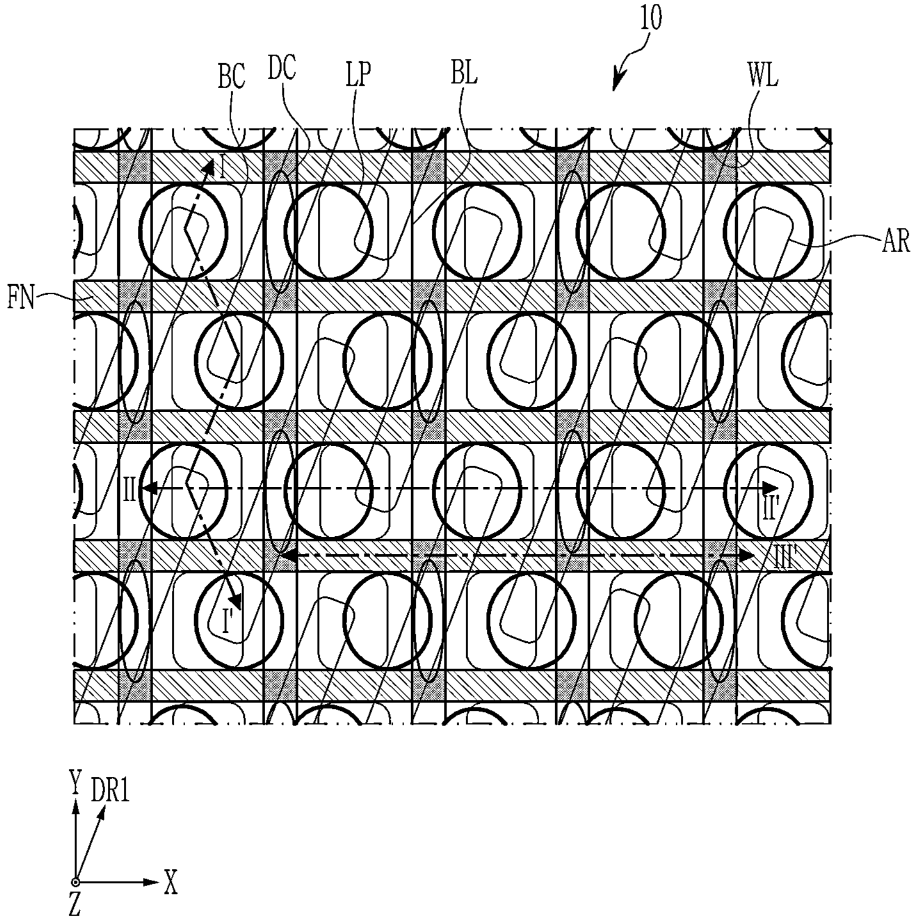
FIG. 1 is a partial plan view illustrating a semiconductor device according to an example embodiment.

In the following detailed description, certain example embodiments of the present disclosure have been illustrated and described, simply by way of illustration. The present disclosure can be variously implemented and is not limited to the following example embodiments.

The drawings and description are to be regarded as illustrative in nature and not restrictive. Like reference numerals designate like elements throughout the specification.

In addition, the size and thickness of each configuration illustrated in the drawings are arbitrarily illustrated for understanding and ease of description, but the present disclosure is not limited thereto. In the drawings, the thickness of layers, films, panels, regions, etc., are exaggerated for clarity. In the drawings, for understanding and ease of description, the thickness of some layers and regions is exaggerated.

Further, it will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, when an element is "on" a reference portion, the element is located above or below the reference portion, and it does not necessarily mean that the element is located "above" or "on" in a direction opposite to gravity.

Further, in the entire specification, when it is referred to as "in plan view", it means when a target part is viewed from above, and when it is referred to as "in cross-sectional view", it means when the cross-section obtained by cutting a target part vertically is viewed from the side.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

As used herein, expressions such as "at least one of," when preceding a list of elements, modify the entire list of elements and do not modify the individual elements of the list. Thus, for example, both "at least one of A, B, or C" and "at least one of A, B, and C" mean either A, B, C or any combination thereof. Likewise, A and/or B means A, B, or A and B.

Hereinafter, a semiconductor device according to an example embodiment will be described with reference to FIGS. 1 to 5.

Figure 2:
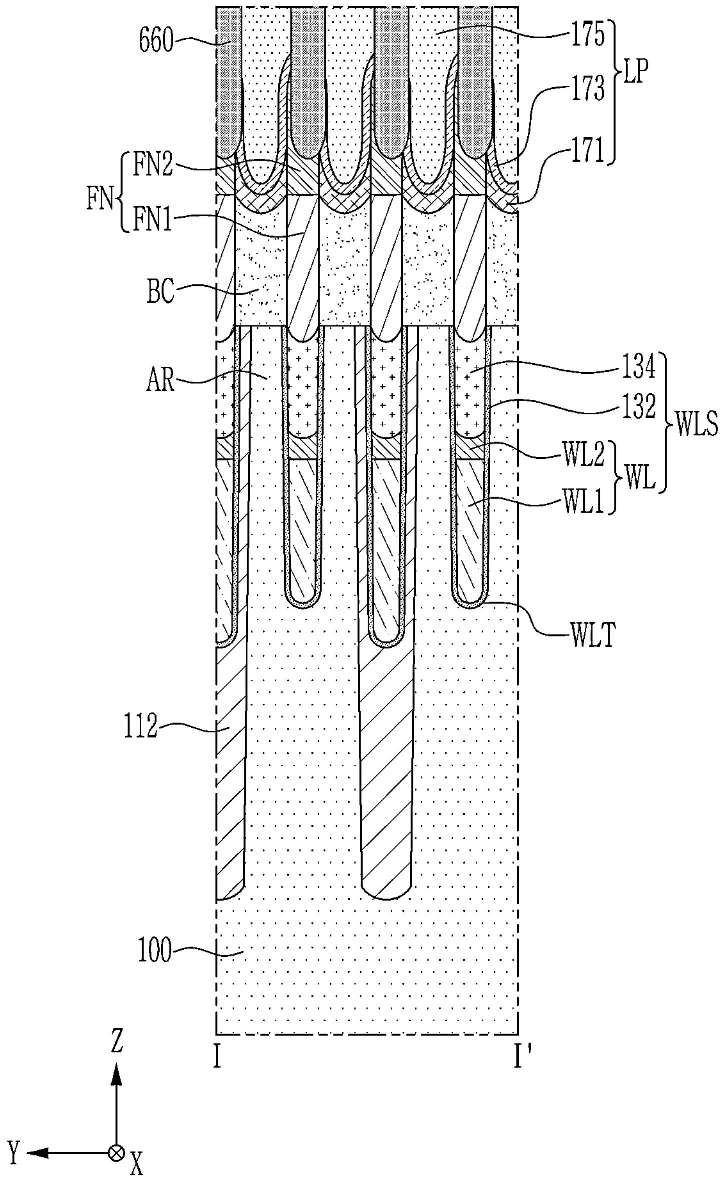
FIG. 2 is a cross-sectional view along the line I-I' of FIG. 1.
Figure 3:
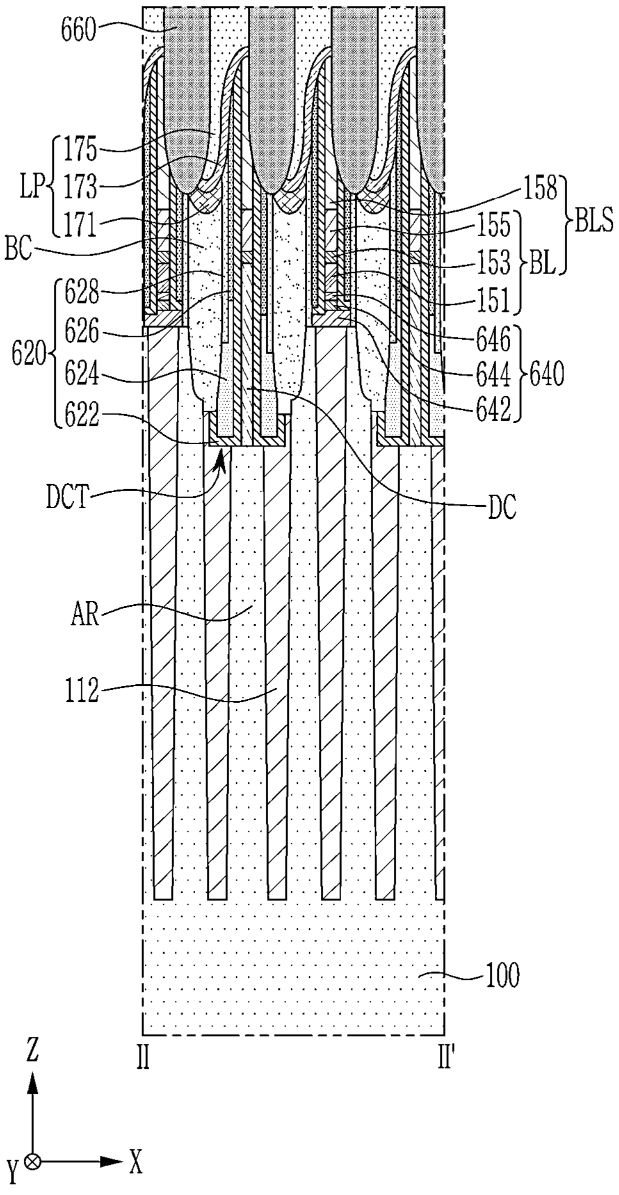
FIG. 3 is a cross-sectional view along the line II-II' of FIG. 1.
Figure 4:
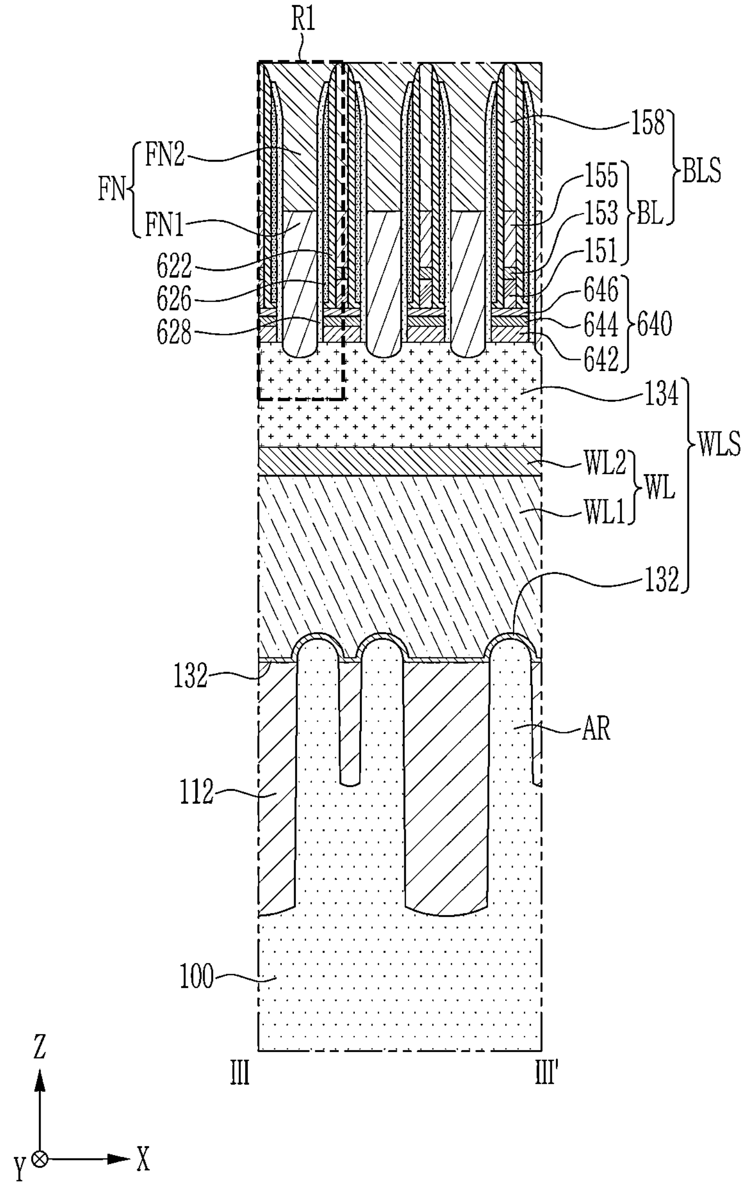
FIG. 4 is a cross-sectional view taken along the line III-III' of FIG. 1.
Figure 5:
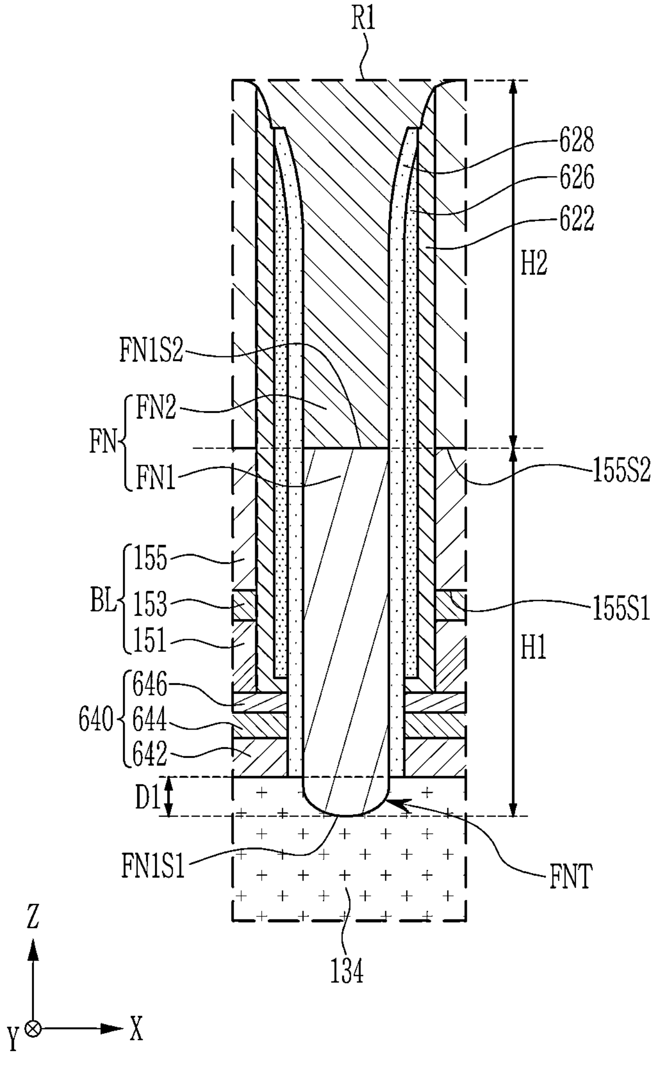
FIG. 5 is a partial enlarged view of the R1 region of FIG. 4.

FIG. 1 is a partial plan view illustrating a semiconductor device according to an example embodiment. FIG. 2 is a cross-sectional view along the line I-I' of FIG. 1. FIG. 3 is a cross-sectional view along the line II-II' of FIG. 1. FIG. 4 is a cross-sectional view taken along the line III-III' of FIG. 1. FIG. 5 is a partial enlarged view of the R1 region of FIG. 4.

Referring to FIGS. 1 to 5, a semiconductor device 10 according to an example embodiment includes an active region AR, a word line WL intersecting and overlapping the active region AR, and a bit line BL intersecting and overlapping the active region AR in a direction different from the word line WL, a direct contact DC connecting the active region AR and the bit lines BL, a buried contact BC connecting the active region AR and a landing pad LP, and a fence pattern FN located between the bit lines BL.

The active region AR may be defined by a device separation layer 112 located within the substrate 100. A plurality of active regions ARs may be located within the substrate 100, the plurality of active regions ARs is separated from each other by the device separation layer 112. On both sides of each active region AR, the device separation layer 112 may be located.

The substrate 100 may include a semiconductor material. For example, the substrate 100 may include a group IV semiconductor, a group III-V compound semiconductor, a group II-VI compound semiconductor, or the like. For example, the substrate 100 may include a semiconductor, such as Si, Ge, or a compound semiconductor, such as SiGe, SiC, GaAs, InAs, or InP. However, the material of the substrate 100 is not limited thereto, and may be varied.

The substrate 100 may have a top surface parallel to a first direction X and a second direction Y, and may have a thickness parallel to a third direction Z perpendicular to the first direction X and the second direction Y.

The active region AR may have a rod shape extending along a fourth direction DR4 oblique to the first direction X and second direction Y. The fourth direction DR4 is parallel to the top surface of the substrate 100 and may be located in the same plane as the first direction X and the second direction Y. The fourth direction DR4 may form an acute angle with the first direction X and the second direction Y, respectively. The plurality of active regions ARs may extend in side-by-side directions.

The plurality of active regions ARs may be spaced at predetermined intervals along the fourth direction DR4 and the first direction X. A center portion of any one active region AR may be adjacent to an end of the other active region AR in the first direction X. An end of one side of any one active region AR may be adjacent to an end of the other side of the other active region AR in the first direction X. However, the shape or placement of the active region AR is not limited thereto and may be varied.

The substrate 100 may include a cell array region and a peripheral circuit region. A cell array region is a region where a plurality of memory cells is formed, and the plurality of active regions ARs may be located in the cell array region. The peripheral circuit region may be located to surround the cell array region, and the devices that drive the memory cells may be located in the peripheral circuit region.

FIGS. 1 to 4 illustrate the cell array region for convenience, and omit illustrations of the peripheral circuit region.

The device separation layer 112 may have a Shallow Trench Insulation (STI) structure with good device insulation properties. The device separation layer 112 may be made of silicon oxide, silicon nitride, or a combination thereof. However, the material of the device separation layer 112 is not limited thereto and may be varied.

The device separation layer 112 may be a single layer or multiple layers. The device separation layer 112 may be made of a single material or may include two or more types of insulating material.

The word line WL may extend along the first direction X and may intersect the active region AR. The word line WL may overlap the active region AR and may act as a gate electrode. One word line WL may overlap a plurality of active regions ARs adjacent in the first direction X.

The semiconductor device 10 according to the example embodiment may include a plurality of word lines WL. The plurality of word lines WL may extend side by side along the first direction X and may be spaced apart from each other at regular intervals along the second direction Y.

Each of a plurality of active regions ARs may intersect and overlap two word lines WLs. Each active region AR may be divided into three parts by two word lines WL. That is, the center portion of the active region AR located between the two word lines WL may be the part connected to the bit line BL, and the ends at the both sides of the active region AR located on the outer side of the two word lines WL may be the parts connected to the capacitor (not illustrated).

The bit line BL may be connected to the active region AR through the direct contact DC. The capacitor may be connected to the active region AR through the landing pad LP and the buried contact BC.

A word line trench WLT may be formed in the substrate 100, and a word line structure WLS may be located within the word line trench WLT. That is, the word line structure WLS may have a form that is embedded within the substrate 100. A portion of the word line trench WLT may be located above the active region AR, and another portion may be located above the device separation layer 112.

As illustrated in FIG. 2, the bottom surfaces of the plurality of word line trenches WLTs may be located at different levels. The bottom surface of the word line trench WLT located above the substrate 100 may be located at a higher level than the bottom surface of the word line trench WLT located above the device separation layer 112.

That is, since the plurality of word line trenches WLTs is etched in separate etch processes for the device separation layer 112 and the substrate 100, a difference may be generated between the etch depth of the device separation layer 112 and the etch depth of the substrate 100. Accordingly, the bottom surface of the plurality of word line trenches WLTs may be located at different levels. However, the method of etching the device separation layer 112 and the substrate 100 is not limited thereto. In some example embodiments, the device separation layer 112 and the substrate 100 may be etched simultaneously. As such, when the device separation layer 112 and the substrate 100 are etched simultaneously, the device separation layer 112 and the substrate 100 include different materials so that the etch depth of the device separation layer 112 and the etch depth of the substrate 100 may be different due to a difference in the etch rate between the device separation layer 112 and the substrate 100.

Herein, the level may refer to a height in the third direction Z, which is a direction perpendicular to the top surface of the substrate 100. That is, being at the same level may mean having the same height in the third direction Z that is the direction perpendicular to the top surface of the substrate 100, and being at a lower or higher level may mean having a lower or higher height in the third direction Z that is the direction perpendicular to the top surface of the substrate 100.

The word line structure WLS may include a gate insulation layer 132, a word line WL located on the gate insulation layer 132, and a word line capping layer 134 located on the word line WL. However, the location, shape, and structure of the word line structure WLS are not limited thereto, and may be varied.

The gate insulation layer 132 may be located within the word line trench WLT. The gate insulation layer 132 may be conformally formed on the inner surface of the word line trench WLT.

The gate insulation layer 132 may include silicon oxide, silicon nitride, silicon nitric oxide, high dielectric constant (high-k) material having a higher dielectric constant than silicon oxide, or a combination thereof. However, the location, shape, and material of the gate insulation layer 132 are not limited thereto and may be varied.

The word line WL may be located on the gate insulation layer 132. The lateral surface and the bottom surface of the word line WL may be surrounded by the gate insulation layer 132. Between the word line WL and the active region AR, the gate insulation layer 132 is located. Thus, the word line WL may not be densely in contact with the active region AR.

The top surface of the word line WL may be located at a lower level than the top surface of the substrate 100. Further, as illustrated in FIG. 4, the lower surface of the word line WL may have a concave shape in cross-section, and the plurality of active regions AR may have saddle FinFETs formed in the saddle Fin structure.

The word line WL may include Ti, TIN, Ta, TaN, W, WN, TiSiN, WSiN, polysilicon, or a combination thereof. However, the location, shape, and material of the word line WL are not limited thereto, and may be varied.

The word line capping layer 134 may be located on the word line WL. The word line capping layer 134 may cover the entire top surface of the word line WL. The lower surface of the word line capping layer 134 may be in contact with the word line WL. The lateral surface of the word line capping layer 134 may be covered by the gate insulation layer 132.

The word line capping layer 134 may include silicon oxide, silicon nitride, silicon nitric oxide, or a combination thereof. However, the location, shape, material, and the like of the word line capping layer 134 is not limited to and may be varied.

The bit line BL may extend along the second direction Y, and may intersect with the active region AR and the word line WL. Here, the bit line BL may intersect vertically with the word line WL. The bit line BL may be located on the word line WL. One bit line BL may overlap the plurality of active regions ARs adjacent in the second direction Y.

The bit line BL may be connected to the active region AR through the direct contact DC. One bit line BL may be connected with the plurality of active regions AR adjacent in the second direction Y. Each of the plurality of active regions ARs may be connected with one bit line BL. The center portion of the active region AR may be connected with the bit line BL. However, this is just one example, and the form of the connection between the bit line BL and the active region AR may be varied.

The semiconductor device 10 according to the example embodiment may include the plurality of bit lines BL. The plurality of bit lines BL may extend side by side along the second direction Y, and may be spaced apart from each other at regular intervals along the first direction X.

A direct contact trench DCT may be formed in the substrate 100, and a direct contact DC may be located within the direct contact trench DCT. A direct contact trench DCT may be located on the active region AR, and a direct contact DC may be connected to the active region AR. The direct contact DC may be directly connected to the active region AR. The direct contact DC may overlap the active region AR in the third direction Z.

The direct contact DC may include conductive materials. For example, the direct contact DC may include polysilicon doped with impurities or metals (e.g., W, Mo, Au, Cu, Al, Ni, or Co).

The bit line BL may be located on the substrate 100 and the direct contact DC. The bit line BL may include a first conductive layer 151, a second conductive layer 153, and a third conductive layer 155 stacked sequentially.

The first conductive layer 151, the second conductive layer 153, and the third conductive layer 155 may include conductive materials. For example, the first conductive layer 151 may include polysilicon doped with impurities or metals (e.g., W, Mo, Au, Cu, Al, Ni, or Co). The second conductive layer 153 may include a metal, such as Ti, and Ta, and/or a metal nitride (e.g., TiN or TaN). The third conductive layer 155 may include a metal (e.g., W, Mo, Au, Cu, Al, Ni, or Co). Due to different materials and regions of the first conductive layer 151, the second conductive layer 153, and the third conductive layer 155, the electrical resistance of the first conductive layer 151, the second conductive layer 153, and the third conductive layer 155 may be different. For example, the first conductive layer 151 may have the highest electrical resistance and the third conductive layer 155 may have the lowest electrical resistance. However, the structure, material, and electrical resistance of the conductive layers configuring the bit lines BL are not limited thereto and may be varied.

The bit line BL may be in direct contact with the direct contact DC. The first conductive layer 151 of the bit line BL may be in contact with the lateral surface of the direct contact DC, and the second conductive layer 153 of the bit line BL may be in direct contact with the top surface of the direct contact DC. The direct contact DC is located between the active region AR and the bit line BL and may provide an electrical connection between the active region AR and the bit line BL. In other words, the bit line BL may be connected to the active region AR through direct contact DC.

The first conductive layer 151 among the conductive layers configuring the bit line BL and the direct contact DC may include the same material. For example, the first conductive layer 151 and the direct contact DC may include polysilicon doped with impurities. However, without limitation, the first conductive layer 151 and the direct contact DC may include different materials.

The bit line capping layer 158 may be located on the bit lines BL. The bit lines BL and the bit line capping layer 158 may form a bit line structure BLS. The bit line capping layer 158 may overlap the bit line BL and direct contact DC in the third direction Z. The bit line BL and the direct contact DC may be patterned using the bit line capping layer 158 as a mask.

The planar shape of the bit line BL may be substantially the same as the bit line capping layer 158. The bit line capping layer 158 is illustrated as being in contact with the third conductive layer 155 of the bit line BL, but is not limited thereto. Other layers may be further located between the bit line capping layer 158 and the third conductive layer 155 of the bit line BL.

The bit line capping layer 158 may include a silicon nitride. However, the material of the bit line capping layer 158 is not limited thereto and may be varied.

On both side of the bit line structure BLS, a spacer structure 620 may be located. The spacer structure 620 may cover the lateral surfaces of the bit line capping layer 158, the bit lines BL, and the direct contacts DC.

The spacer structure 620 may extend in the approximate third direction Z along the lateral surface of the bit line structure BLS. At least a portion of the spacer structure 620 may be located within the direct contact trench DCT. Within the direct contact trench DCT, the spacer structure 620 may be located on both sides of the direct contact DC.

The spacer structure 620 may be formed of multiple layers of a combination of different types of insulating materials. The spacer structure 620 may include a first spacer 622, a second spacer 624, a third spacer 626, and a fourth spacer 628. However, the spacer structure 620 is not limited thereto, and the number and structure of the layers configuring the spacer structure 620 may be varied.

The spacer structure 620 may also be formed of a single layer. In some example embodiments, the spacer structure 620 may be formed in an air spacer structure with air spaces surrounded between the spacers.

The first spacer 622 may cover the lateral surfaces of the bit line structure BLS and the direct contact DC. Within the direct contact trench DCT, the first spacer 622 may cover the bottom surface and the lateral surface of the direct contact trench DCT.

The second spacer 624 may be located on the first spacer 622. The lower surface and the lateral surface of the second spacer 624 may be surrounded by the first spacer 622. The second spacer 624 may be located within the direct contact trench DCT. The second spacer 624 may fill the direct contact trench DCT. Within the direct contact trench DCT, the second spacer 624 may be located on both sides of the direct contact DC.

The third spacer 626 may be located on the first spacer 622 and the second spacer 624. The third spacer 626 may overlap the first spacer 622 along the first direction X, and may overlap the second spacer 624 along the third direction Z. The third spacer 626 may extend in the approximate third direction Z along the lateral surface of the first spacer 622. The third spacer 626 may extend side-by-side with the first spacer 622. The lower surface and the lateral surface of the third spacer 626 may be surrounded by the first spacer 622, the second spacer 624, and the fourth spacer 628.

The fourth spacer 628 may be located on the second spacer 624 and the third spacer 626. The fourth spacer 628 may overlap the second spacer 624 along the third direction Z, and may overlap the third spacer 626 along the first direction X. The fourth spacer 628 may extend along a lateral surface of the third spacer 626 in the approximately third direction Z. The fourth spacer 628 may extend in parallel with the first spacer 622 and the third spacer 626. The lower surface and the lateral surface of the fourth spacer 628 may be surrounded by the second spacer 624 and the third spacer 626.

The spacer structure 620 may include an insulating material. Each of the first spacer 622, the second spacer 624, the third spacer 626, and the fourth spacer 628 may include the same material. Alternatively, at least some of the first spacer 622, the second spacer 624, the third spacer 626, and the fourth spacer 628 may include different materials.

Each of the first spacer 622, the second spacer 624, the third spacer 626, and the fourth spacer 628 may include at least one of silicon nitride, silicon nitric oxide, silicon oxide, silicon carbon oxide, silicon carbonitride, silicon oxycarbon nitride, or combinations thereof. For example, the first spacer 622 and the third spacer 626 may include silicon oxide, and the second spacer 624 and the fourth spacer 628 may include silicon nitride. However, the material of the spacer structure 620 is not limited thereto and may be varied.

Below the bit line BL, an insulation layer 640 may be located. The insulation layer 640 may be located between the bit line BL and the device separation layer 112. The direct contact DC is located between the bit line BL and the active region AR, and the insulation layer 640 may not be located. The insulation layer 640 may be located on the word line structure WLS. The insulation layer 640 may be located between the word line structure WLS and the bit line BL. The insulation layer 640 may include a first insulation layer 642, a second insulation layer 644, and a third insulation layer 646 sequentially stacked.

At least some of the first insulation layer 642, the second insulation layer 644, and the third insulation layer 646 may have different widths. The widths of the second insulation layer 644 and the third insulation layer 646 may be substantially the same. The width of the second insulation layer 644 and the third insulation layer 646 may be substantially the same as the width of the bit line BL and the bit line capping layer 158. In some example embodiments, the width of the first insulation layer 642 may be different from the width of the second insulation layer 644 and the width of the third insulation layer 646. The width of the first insulation layer 642 may be greater than the width of the second insulation layer 644 and the width of the third insulation layer 646. Thus, the width of the first insulation layer 642 may be greater than the width of the bit line BL.

The insulation layer 640 may be covered by the spacer structure 620. For example, the top surface of the first insulation layer 642 may be covered by the first spacer 622. The lateral surfaces of the second insulation layer 644 and the third insulation layer 646 may be covered by the first spacer 622.

The insulation layer 640 may include an insulating material. Each of the first insulation layer 642, the second insulation layer 644, and the third insulation layer 646 may include an insulating material. For example, the first insulation layer 642 may include a silicon oxide. The second insulation layer 644 may include a material having a different etch selectivity from that of the first insulation layer 642. For example, the second insulation layer 644 may include silicon nitride. For example, the third insulation layer 646 may include silicon oxide or silicon nitride. However, the structure, the material, and the like of the insulation layer 640 is not limited thereto and may be varied.

As illustrated in FIG. 3, the buried contact BC may be located between the plurality of bit lines BL. The semiconductor device 10 according to the example embodiment may include a plurality of buried contacts BCs. The plurality of buried contacts BCs may be arranged to be spaced apart from each other along the first direction X and the second direction Y. For example, the plurality of buried contacts BC may be arranged between two adjacent bit lines BL such that they are spaced apart along the second direction Y. Additionally, the plurality of buried contacts BC may be arranged between two adjacent word lines WL such that they are spaced apart along the first direction X. However, the arrangement form of the plurality of buried contacts BCs is not limited thereto and may be varied.

At least some of the buried contacts BC may overlap the active region AR in the third direction Z, and others may overlap the device separation layer 112 in the third direction Z. The buried contact BC may be electrically connected to the active region AR. The buried contact BC may be directly in contact with the active region AR. The lower surface and at least a portion of the lateral surface of the buried contact BC are surrounded by the active region AR. However, without limitation, other layers may be further located between the buried contact BC and the active region AR, and the buried contact BC may be connected to the active region AR through other layers.

The buried contact BC may include conductive material. For example, the buried contact BC may include, but is not limited to, polysilicon doped with impurities.

The spacer structure 620 may be located on both sides of the buried contact BC. The spacer structure 620 may be located between the buried contact BC and the bit line BL. For example, one side surface of the buried contact BC may be in contact with the fourth spacer 628 and the active region AR, and the other side of the buried contact BC may be in contact with the fourth spacer 628 and the second spacer 624. The lower surface of the buried contact BC may be in contact with the first spacer 622. However, this is just one example, and the positional relationship between the buried contact BC and the spacer structure 620 may be varied.

The top surface of the buried contact BC may be located at a lower level than the top surface of the bit line BL, and the lower surface of the buried contact BC may be located at a higher level than the lower surface of the direct contact DC. However, the present disclosure is not limited to this, and the positional relationship of the buried contacts BC to the bit lines BL and direct contacts DC may be varied.

Fence patterns FN may be located between the bit lines BL and between the buried contacts BC. In other words, the fence pattern FN may be located between the bit lines BL spaced apart in the first direction X. Additionally, the fence pattern FN may be located between the buried contacts BC spaced apart in the second direction Y.

In the example embodiment, the fence pattern FN extends along the first direction X and may be located on the word line capping layer 134 in plan. The width of the fence pattern FN along the second direction Y may be substantially the same as the width of the word line capping layer 134 along the second direction Y, or may be smaller than the width of the word line capping layer 134 along the second direction Y. However, the planar shape of the fence pattern FN and the width of the fence pattern FN are not limited thereto and may be varied.

The fence pattern FN may be located within a fence pattern trench FNT located between the plurality of bit lines BL and between the plurality of buried contacts BC. That is, the fence pattern FN overlaps the word line capping layer 134 along the third direction Z, and may extend along the third direction Z between the bit lines BL and between the buried contacts BC.

The lateral surface of the fence pattern FN may be in direct contact with the buried contact BC and the landing pad LP, which will be discussed later. Additionally, the lateral surface of the fence pattern FN may be directly in contact with the first spacer 622 and the fourth spacer 628, which are located on the outermost sides of the spacer structure 620.

The bottom surface of the fence pattern trench FNT is formed of the top surface of the word line capping layer 134, the lateral surface of the fence pattern trench FNT spaced apart in the first direction X may be formed of the spacer structures 620, and the lateral surface of the fence pattern trench FNT spaced apart in the second direction Y may be formed of the buried contact BC.

The word line capping layer 134 may be recessed by the fence pattern trench FNT. That is, the top surface of the word line capping layer 134, which constitutes the bottom surface of the fence pattern trench FNT, may be recessed along the bottom surface of the fence pattern trench FNT. In other words, the bottom surface of the fence pattern trench FNT may have a recessed shape (e.g., concave shape) from the top surface of the word line capping layer 134 toward the lower surface of the word line capping layer 134.

Accordingly, the bottom surface of the fence pattern trench FNT may be located at a lower level than the top surface of the active region AR and the lower surface of the buried contact BC. Additionally, the bottom surface of the fence pattern trench FNT may be located at a lower level than the lower surface of the first insulation layer 642.

Additionally, the fence pattern FN located within the fence pattern trench FNT may be directly in contact with the word line capping layer 134. As the fence pattern FN is located within the fence pattern trench FNT, the lower surface of the fence pattern FN may be located at a lower level than the top surface of the active region AR and the lower surface of the buried contact BC. Additionally, the lower surface of the fence pattern FN may be located at a lower level than the lower surface of the first insulation layer 642.

The bottom surface of the fence pattern trench FNT may include a curved surface. Accordingly, the lower surface of the fence pattern FN located within the fence pattern trench FNT may include a curved surface. However, the shape of the bottom surface of the fence pattern trench FNT is not limited thereto, and the shape of the bottom surface of the fence pattern trench FNT that is indented from the top surface of the word line capping layer 134 toward the lower surface of the word line capping layer 134 may be varied. For example, the bottom surface of the fence pattern trench FNT may be indented from the top surface of the word line capping layer 134 toward the lower surface of the word line capping layer 134 in a rectangular shape or a shape of which the width decreases toward the substrate 100. Accordingly, the shape of the lower surface of the fence pattern FN may be varied.

The fence pattern FN according to the example embodiment may include the plurality of insulation layers made of different materials. For example, the fence pattern FN may include a first fence pattern FN1 and a second fence pattern FN2 stacked sequentially within the fence pattern trench FNT. That is, the fence patterns FN may include a first fence pattern FN1 that is directly in contact with the word line capping layer 134 and a second fence pattern FN2 that is located on the first fence pattern FN1.

The first fence pattern FN1 and the second fence pattern FN2 may include an insulating material, and the first fence pattern FN1 and the second fence pattern FN2 may include different materials. That is, the first fence pattern FN1 may include a first material, and the second fence pattern FN2 may include a second material that is different from the first material.

In the example embodiment, the permittivity of the first material may be smaller than the permittivity of the second material. For example, the first material may include silicon oxide, or a low dielectric constant (low-k) material, such as SiBN, SiCN, SiOCH, and SiOC, having a lower dielectric constant than silicon oxide, and the second material may include silicon nitride, silicon nitric oxide, or a combination thereof. However, the first material and the second material are not limited thereto and may be varied.

In the example embodiment, the first fence pattern FN1 may overlap at least a portion of the first conductive layer 151, the second conductive layer 153, and the third conductive layer 155 of the bit line BL in the first direction X, and the second fence pattern FN2 may overlap at least a portion of the bit line capping layer 158 in the first direction X.

For example, the first fence pattern FN1 may be in contact with all of the first conductive layer 151, the second conductive layer 153, and the third conductive layer 155 of the bit line BL in the first direction X.

The second fence pattern FN2 does not overlap the first conductive layer 151, the second conductive layer 153, and the third conductive layer 155 of the bit line BL in the first direction X, and may overlap the bit line capping layer 158 in the first direction X. Further, the first fence pattern FN1 may overlap the first spacer 622, the third spacer 626, and the fourth spacer 628 in the first direction X.

A lower surface FN1S1 of the first fence pattern FN1 may be located at a lower level than the top surface of the word line capping layer 134 adjacent to the fence pattern trench FNT. That is, the first fence pattern FN1 may penetrate the insulation layer 640. A top surface FN1S2 of the first fence pattern FN1 may be located at a higher level than a lower surface 155S1 of the third conductive layer 155, and may be located at substantially the same level as a top surface 155S2 of the third conductive layer 155. Accordingly, the first fence pattern FN1 extends from the word line capping layer 134 along the third direction Z, and may overlap all of the first conductive layer 151, the second conductive layer 153, and the third conductive layer 155 of the bit line BL in the first direction X.

Further, the width of the lower surface of the second fence pattern FN2 may be smaller than the width of the top surface of the second fence pattern FN2. The top surface of the second fence pattern FN2 may be located substantially at the same level as the top surface of the bit line capping layer 158. The second fence pattern FN2 may cover the first spacer 622, the third spacer 626, and the fourth spacer 628. However, the configuration, arrangement, shape, and arrangement relationship of the fence pattern FN with neighboring configurations are not limited thereto, and may be varied.

The first fence pattern FN1 may have a first length H1 along the third direction Z, and the second fence pattern FN2 may have a second length H2 along the third direction Z. In the example embodiment, the first length H1 and the second length H2 may be substantially equal. That is, the ratio of the first length H1 to the second length H2 may be about 1:1.

For example, each of the first length H1 and the second length H2 may be from about 400 Å to 600 Å. When each of the first length H1 and the second length H2 has the above numerical value range, as the first fence pattern FN1 including a material having a relatively low dielectric constant (low-k) compared to the second fence pattern FN2 overlaps at least a portion of the first conductive layer 151, the second conductive layer 153, and the third conductive layer 155 of the bit line BL, parasitic capacitance between neighboring buried contacts BC, between the buried contacts BC and the bit lines BL, and between the bit lines BL may be reduced.

Further, as the second fence pattern FN2, which is located on the first fence pattern FN1, has the second length H2 in the third direction Z, the second fence pattern FN2 is located between the landing pads LPs which is to be described below, to mitigate or prevent neighboring landing pads LPs from being in contact with each other. However, the first length H1 of the first fence pattern FN1 along the third direction Z and the second length H2 of the second fence pattern FN2 along the third direction Z are not limited thereto, and may be varied.

In the example embodiment, the depth D1 of the portion where the top surface of the word line capping layer 134 is recessed toward the lower surface of the word line capping layer 134 by the fence pattern trench FNT may be about 40 Å to 50 Å.

Here, the depth D1 of the portion where the top surface of the word line capping layer 134 is recessed toward the lower surface of the word line capping layer 134 by the fence pattern trench FNT may mean a depth along the third direction Z from the deepest portion of the bottom surface of the fence pattern trench FNT to the top surface of the word line capping layer 134 located on both sides of the fence pattern trench FNT.

When the depth D1 of the word line capping layer 134 recessed from the top surface of the word line capping layer 134 toward the lower surface of the word line capping layer 134 has the above numerical value range, in the process operation of etching the conductive material layer (see "170P" in FIG. 21) to form the fence pattern FN, it is possible to mitigate or prevent the conductive material layer from remaining on the word line capping layer 134.

That is, by over-etching the word line capping layer 134 so that the word line capping layer 134 is recessed from the top surface toward the lower surface in order to mitigate or prevent the conductive material layer from remaining on the word line capping layer 134 in the process operation of forming the fence pattern trench FNT to form the fence pattern FN, the depth D1 of the word line capping layer 134 recessed from the top surface of the word line capping layer 134 toward the lower surface of the word line capping layer 134 may have the above numerical value range. However, the depth D1 of the word line capping layer 134 recessed from the top surface of the word line capping layer 134 toward the lower surface of the word line capping layer 134 is not limited to the above numerical value range and may be varied.

The landing pad LP may be located on the buried contact BC. The semiconductor device 10 according to the example embodiment may include the plurality of landing pads LPs. The plurality of landing pads LPs may be arranged while being spaced apart from each other along the first direction X and the second direction Y. The plurality of landing pads LPs may be arranged in a row along the first direction X. The plurality of landing pads LPs may be arranged in a zigzag form along the second direction Y. For example, the plurality of landing pads LPs may be alternately arranged on the left and right side relative to the bit line BL. However, the arrangement form of the plurality of landing pads LPs is not limited to this example, and may be varied.

The landing pad LP may cover the top surface of the buried contact BC and may overlap the buried contact BC in the third direction Z. At least a portion of the landing pad LP may overlap the spacer structure 620 in the third direction Z, and may overlap the bit line BL in the third direction Z. The top surface of the landing pad LP may be located at a higher level than the top surface of the bit line capping layer 158. The spacer structure 620 may be located on both sides of the landing pad LP. The spacer structure 620 may be located between the landing pad LP and the bit line BL, and between the landing pad LP and the bit line capping layer 158. The landing pad LP may be electrically connected to the buried contact BC. The landing pad LP may be in direct contact with the buried contact BC. The landing pad LP may be electrically connected to the active region AR through the buried contact BC.

The landing pad LP may include a metal silicide layer 171, a conductive barrier layer 173, and a conductive layer 175. The metal silicide layer 171 may be located on the buried contact BC, the conductive barrier layer 173 may be located on the metal silicide layer 171, and the conductive layer 175 may be located on the conductive barrier layer 173.

The metal silicide layer 171 may be in direct contact with the buried contact BC. The metal silicide layer 171 may cover the entire top surface of the buried contact BC. The top surface of the buried contact BC may have a concave shape, and the metal silicide layer 171 may have a concave shape along the top surface of the buried contact BC. On both sides of the metal silicide layer 171 the spacer structure 620 may be located. For example, the metal silicide layer 171 may be in contact with the fourth spacer 628.

The top surface of the buried contact BC may be located at a lower level than the top surface of the first fence pattern FN1. The top surface of the metal silicide layer 171 may be substantially the same as, or at a higher level than, the top surface of the first fence pattern FN1. However, the arrangement relationship of the buried contact BC to the first fence pattern FN1 and the arrangement relationship of the metal silicide layer 171 to the first fence pattern FN1 are not limited thereto, and may be varied.

The metal silicide layer 171 may include a metal silicide material (e.g., as cobalt silicide, nickel silicide, or manganese silicide). However, the shape, the material, and the like of the metal silicide layer 171 are not limited thereto, and may be varied. In some example embodiments, the metal silicide layer 171 may be omitted.

The conductive barrier layer 173 may be located between the metal silicide layer 171 and the conductive layer 175. The lower surface of the conductive barrier layer 173 may be in contact with the metal silicide layer 171. On both sides of the conductive barrier layer 173, the spacer structure 620 may be located. For example, the conductive barrier layer 173 may cover the top surface of the fourth spacer 628, the third spacer 626, and the first spacer 622.

The conductive barrier layer 173 may be in contact with the fourth spacer 628, the third spacer 626, and the first spacer 622.

The landing pad LP may be in direct contact with the fence pattern FN. For example, the metal silicide layer 171 and the conductive barrier layer 173 may be directly in contact with the lateral surface of the second fence pattern FN2. That is, the metal silicide layer 171 and the conductive barrier layer 173 are located on the lateral surface of the second fence pattern FN2 and may cover the second fence pattern FN2. However, the arrangement relationship of the conductive barrier layer 173 and the second fence pattern FN2 is not limited thereto, and may be varied.

The conductive barrier layer 173 may include Ti, TIN, or a combination thereof. However, the shape, the material, and the like of the conductive barrier layer 173 are not limited thereto and may be varied.

The lower surface of the conductive layer 175 may be in contact with the conductive barrier layer 173. The lower surface and at least a portion of the lateral surface of the conductive layer 175 may be surrounded by the conductive barrier layer 173. The conductive barrier layer 173 may be located between the conductive layer 175 and the metal silicide layer 171. The conductive barrier layer 173 may be located between the conductive layer 175 and the spacer structure 620.

The conductive layer 175 may include a metal, a metal nitride, a polysilicon doped with an impurity, or a combination thereof. For example, the conductive layer 175 may include W. However, the shape, the material, and the like of the conductive layer 175 are not limited thereto, and may be varied.

An insulation pattern 660 may be located between the plurality of landing pads LPs. The insulation pattern 660 may be formed to fill the space between the plurality of landing pads LPs. The plurality of landing pads LPs may be separated from each other by the insulation pattern 660.

The insulation pattern 660 may be located on the second fence pattern FN2. The insulation pattern 660 may recess the second fence pattern FN2 from the top surface of the second fence pattern FN2 toward the lower surface of the second fence pattern FN2. Accordingly, the insulation pattern 660 may have a shape protruding toward the second fence pattern FN2. In other words, the second fence pattern FN2 may be shaped by the insulation pattern 660 to have a lower surface that is indented from the top surface.

The insulation pattern 660 may include silicon nitride, silicon nitric oxide, silicon oxide, or a combination thereof. The insulation pattern 660 may be formed of a single layer or multiple layers. For example, the insulation pattern 660 may include a first material layer and a second material layer that are stacked.

Here, the first material layer may include silicon oxide, or a low dielectric constant (low-k) material (e.g., SiOCH or SiOC) having a lower dielectric constant than silicon oxide, and the second material layer may include silicon nitride or silicon nitric oxide. However, the shape, the material, and the like of the insulation pattern 660 are not limited thereto, and may be varied.

Although not illustrated, a capacitor structure may be located on the landing pad LP. The capacitor structure may include a first capacitor electrode, a second capacitor electrode, and a dielectric layer located between the first capacitor electrode and the second capacitor electrode. The first capacitor electrode may be in contact with the landing pad LP and may be electrically connected to the landing pad LP. The capacitor structure may be electrically connected to the active region AR through the landing pad LP and the buried contact BC.

The semiconductor device 10 according to the example embodiment may include a plurality of capacitor structures. The first capacitor electrode may be located on each landing pad LP, and the plurality of first capacitor electrodes may be located to be separated from each other. The second capacitor electrodes of the plurality of capacitor structures may be substantially supplied with the same voltage, and may be integrally formed. The dielectric layers of the plurality of capacitor structures may be integrally formed.

According to the semiconductor device 10 according to the example embodiment, the fence pattern FN, in which the first fence pattern FN1 including an insulating material having a relatively low dielectric constant and the second fence pattern FN2 including an insulating material having relatively high tolerance in the subsequent process operation (e.g., an etching process operation) to form the buried contact BC are sequentially stacked, is formed between the buried contacts BC and the bit lines BL, thereby providing the semiconductor device 10 with improved productivity and reliability.

That is, as the first fence pattern FN1 including an insulating material having a relatively low dielectric constant overlaps with the conductive layers 151, 153, and 155 of the bit line BL, the parasitic capacitance between neighboring bit lines BL and the parasitic capacitance between neighboring buried contacts BC and the bit lines BL may be reduced, thereby improving the electrical characteristics of the semiconductor device 10.

Furthermore, the second fence pattern FN2 including an insulating material having relatively high tolerance relative to the first fence pattern FN1 in the subsequent process operation (e.g., an etching process operation) to form the buried contact BC is formed on the first fence pattern FN1, so that the subsequent process operation may be performed smoothly, thereby improving the productivity of the semiconductor device 10.

Referring now to FIGS. 6 to 16, other example embodiments of the semiconductor device will be described. In the following example embodiments, configurations that are identical to those of the previously described example embodiment will be referred to by the same reference numerals, and redundant descriptions will be omitted or simplified, and differences will be emphasized.

FIGS. 6 to 16 are cross-sectional views illustrating semiconductor devices according to some example embodiments. Each of FIGS. 6 to 16 illustrates R2 region to the R12 region, respectively, corresponding to R1 region of FIG. 4.

Figure 6:
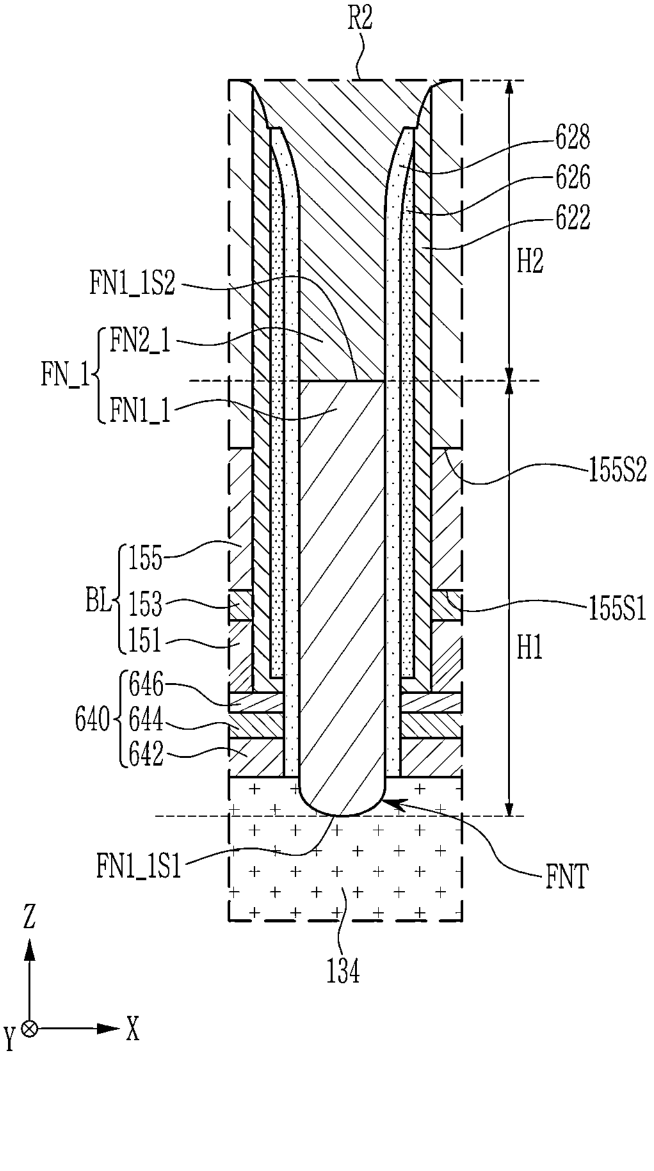
FIGS. 6 to 16 are cross-sectional views illustrating semiconductor devices according to some example embodiments.
Figure 7:
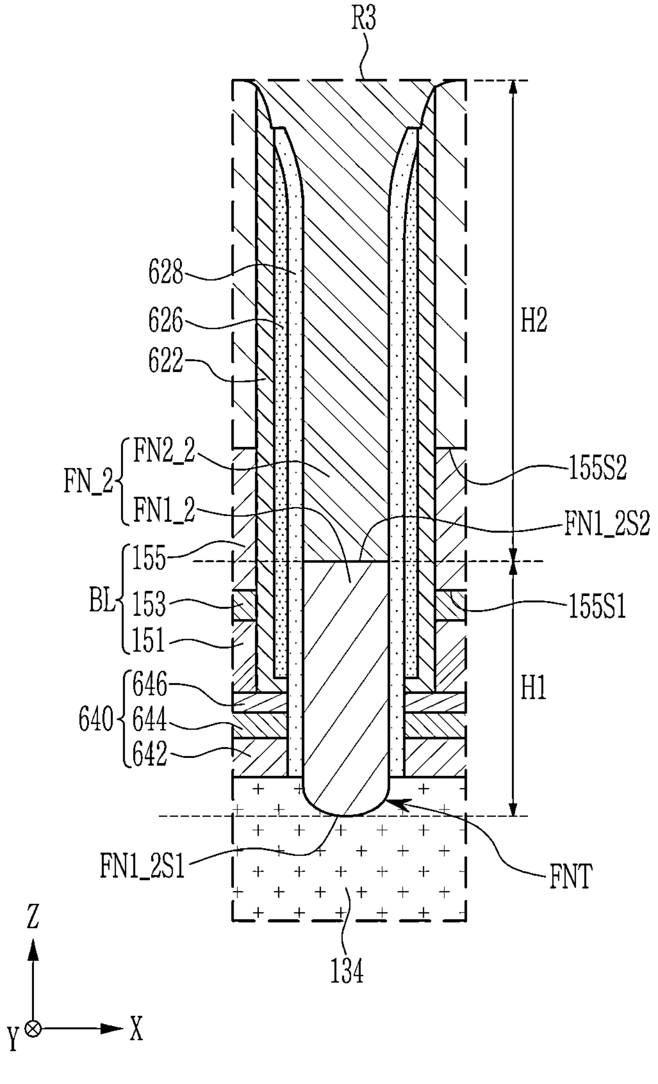

Fence patterns FN_1 and FN_2 according to the example embodiments illustrated in FIGS. 6 and 7 are different from the fence pattern FN according to the example embodiment illustrated in FIG. 5 in that the arrangement relationship between first fence patterns FN1_1, FN1_2 and a third conductive layer 155 of a bit line BL is different.

Also, the example embodiments illustrated in FIGS. 6 and 7 are different from the example embodiment illustrated in FIG. 5 in that lengths of first fence patterns FN1_1, FN1_2 and second fence patterns FN2_1, FN2_2 in the third direction Z are different.

For example, referring to FIG. 6, a top surface FN_1S2 of the first fence pattern FN1_1 may be located at a higher level than a top surface 155S2 of the third conductive layer 155 of the bit line BL. In other words, the first fence pattern FN1_1 may be located to extend further in the third direction Z than the first fence pattern FN1 according to the example embodiment illustrated in FIG. 5.

Accordingly, unlike the example embodiment illustrated in FIG. 5, a first length H1 along the third direction Z of the first fence pattern FN1_1 may be larger than a second length H2 along the third direction Z of the second fence pattern FN2_1. That is, the first length H1 along the third direction Z of the first fence pattern FN1_1 and the second length H2 along the third direction Z of the second fence pattern FN2_1 may be different from each other.

In the case of the present example embodiment, compared to the example embodiment illustrated in FIG. 5, the region of the first fence pattern FN1_1 including an insulating material having a relatively low dielectric constant than the second fence pattern FN2_1 is increased, so that the parasitic capacitance between the bit lines BL may be effectively reduced.

Referring to FIG. 7, a top surface FN1_2S2 of the first fence pattern FN1_2 may be located at a lower level than a top surface 155S2 of the third conductive layer 155 of the bit line BL. That is, the top surface FN1_2S2 of the first fence pattern FN1_2 may be located at a level between a lower surface 155S1 and the top surface 155S2 of the third conductive layer 155 of the bit line BL. Accordingly, the first fence pattern FN1_2 may overlap the first conductive layer 151, the second conductive layer 153, and a portion of the third conductive layer 155 of the bit line BL in the first direction X.

Unlike the example embodiment illustrated in FIG. 5, the first length H1 of the first fence pattern FN1_2 along the third direction Z according to the present example embodiment may be smaller than the second length H2 of the second fence pattern FN2_2 along the third direction Z.

In accordance with the present example embodiment, compared to the example embodiment illustrated in FIG. 5, the region of the first fence pattern FN1_1, which includes an insulating material having a relatively low dielectric constant than the second fence pattern FN2_1, is reduced, but the first fence pattern FN1_1 overlaps the portion of the third conductive layer 155, which includes a material having the lowest resistance among the conductive layers 151, 153, and 155 of the bit lines BLs, so that the parasitic capacitance between the bit lines BLs may be reduced.

Figure 8:
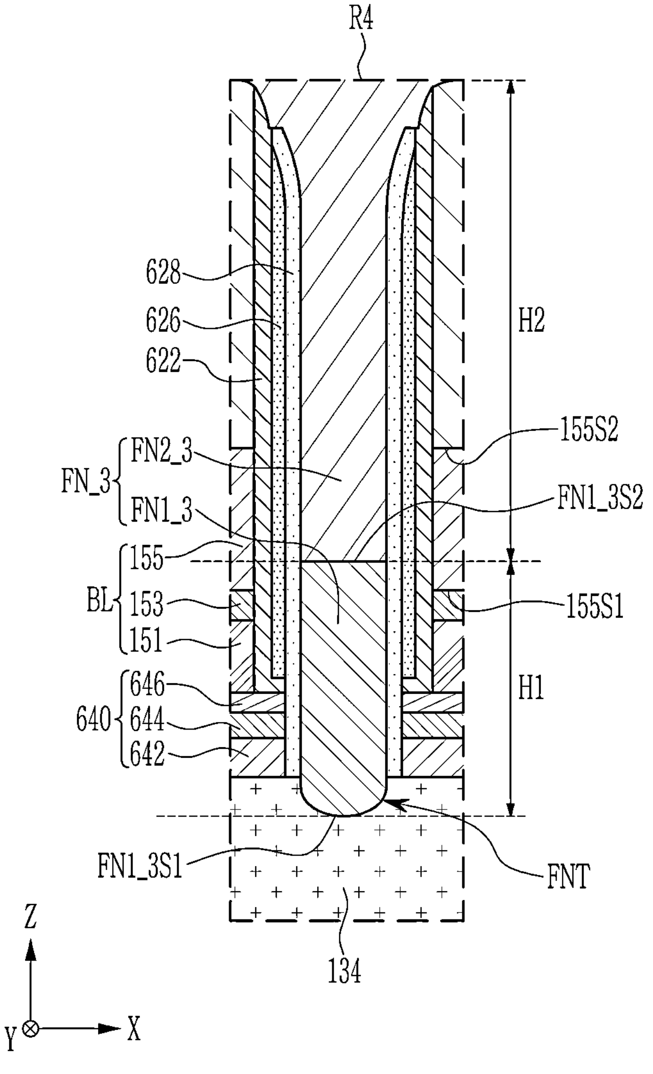
Figure 9:
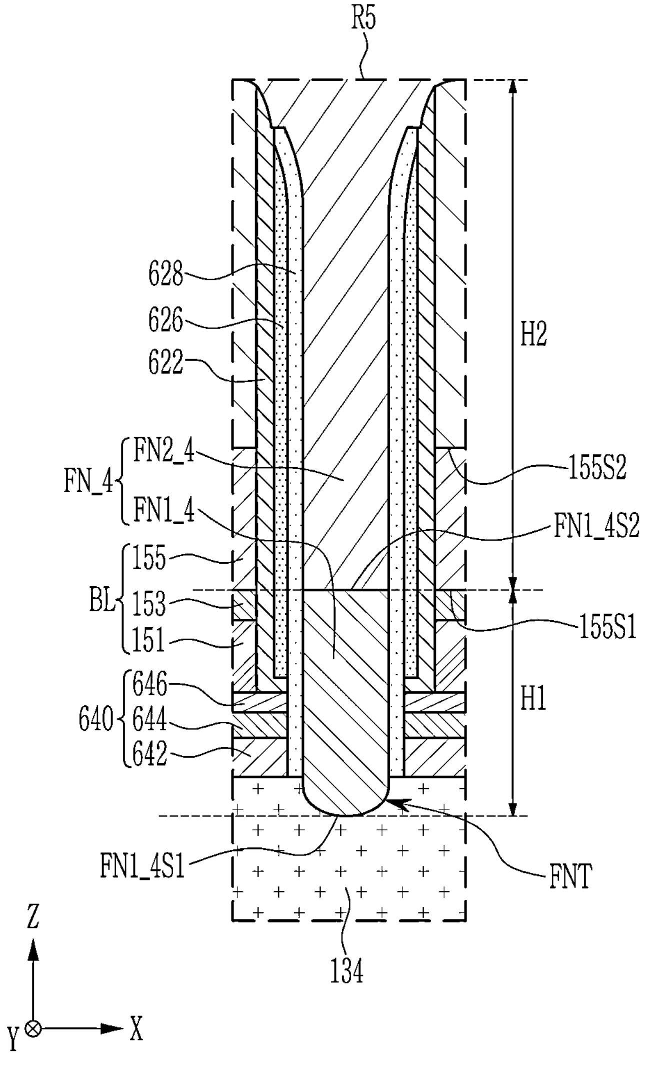
Figure 10:
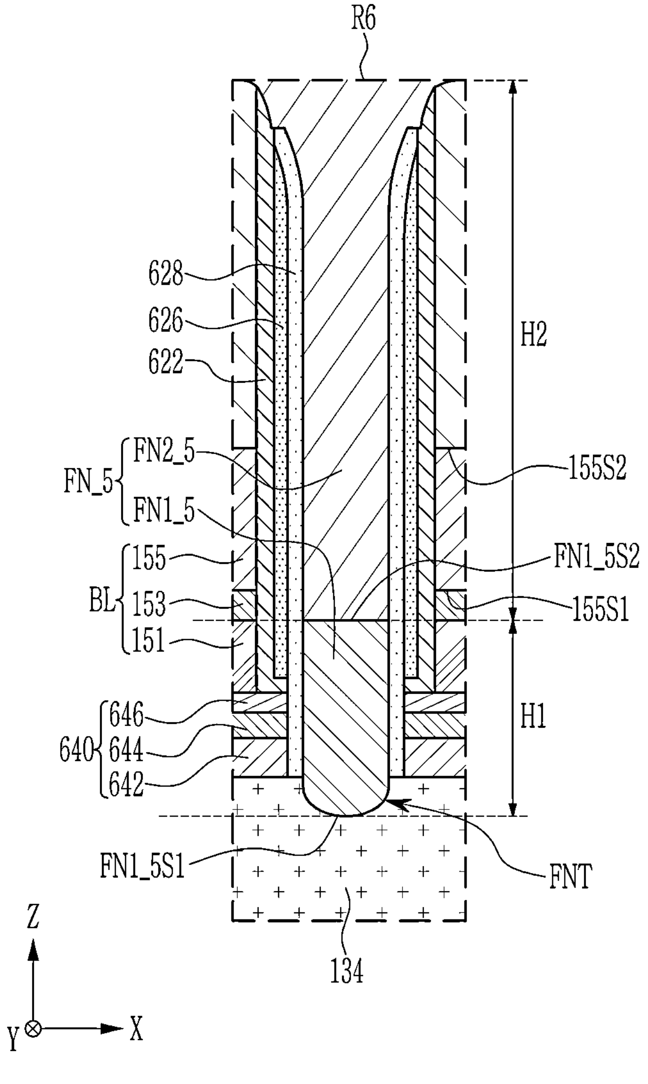

Fence patterns FN_3, FN_4, and FN_5 according to the example embodiments illustrated in FIGS. 8 to 10 are different from the fence patterns FN according to the example embodiment illustrated in FIG. 5 in that first fence pattern FN1_3, FN1_4, and FN1_5 and second fence pattern FN2_3, FN2_4, and FN2_5 include different materials. Further, the first length H1 of the first fence patterns FN1_3, FN1_4, and FN1_5 along the third direction Z may be smaller than the second length H2 of the second fence patterns FN2_3, FN2_4, FN2_5 along the third direction Z.

For example, referring to FIGS. 8 to 10, the first fence patterns FN1_3, FN1_4, and FN1_5 may include the second material described above, and the second fence patterns FN2_3, FN2_4, and FN2_5 may include the first material described above. For example, the first fence patterns FN1_3, FN1_4, and FN1_5 may include silicon nitride, silicon nitric oxide, or a combination thereof, and the second fence patterns FN2_3, FN2_4, and FN2_5 may include silicon oxide, or a low dielectric constant (low-k) material, such as SiBN, SiCN, SiOCH, and SiOC, having a lower dielectric constant than silicon oxide. However, the first material and the second material are not limited thereto and may be varied.

According to the example embodiment illustrated in FIG. 8, a top surface FN1_3S2 of the first fence pattern FN1_3 may be located at a level between a lower surface 155S1 and a top surface 155S2 of a third conductive layer 155 of a bit line BL.

Accordingly, the second fence pattern FN2_3, which is located on the first fence pattern FN1_3, may extend from the top surface of a bit line capping layer 158 toward a top surface FN1_3S2 of the first fence pattern FN1_3 to not overlap the first conductive layer 151 and the second conductive layer 153 of the bit line BL, and overlap a portion of the third conductive layer 155 of the bit line BL in the first direction X.

According to the example embodiment illustrated in FIG. 9, a top surface FN1_4S2 of a first fence pattern FN1_4 may be located at the substantially same level as a lower surface 155S1 of a third conductive layer 155 of a bit line BL.

Accordingly, the second fence pattern FN2_4, which is located on the first fence pattern FN1_4, may extend from a top surface of a bit line capping layer 158 toward a top surface FN1_4S2 of the first fence pattern FN1_4 to not overlap the first conductive layer 151 and the second conductive layer 153 of the bit line BL, and overlap the entire third conductive layer 155 of the bit line BL in the first direction X.

According to the example embodiment illustrated in FIG. 10, a top surface FN1_5S2 of a first fence pattern FN1_5 may be located at a lower level than a lower surface 155S1 of a third conductive layer 155 of a bit line BL. A top surface FN1_5S2 of the first fence pattern FN1_5 may be located at the substantially same level as a lower surface of the second conductive layer 153 of the bit line BL.

Accordingly, a second fence pattern FN2_5, which is located on the first fence pattern FN1_5, may extend from a top surface of a bit line capping layer 158 toward a top surface FN1_5S2 of the first fence pattern FN1_5 to not overlap the first conductive layer 151 of the bit line BL, and overlap an entirety of the second conductive layer 153 and an entirety of the third conductive layer 155 of the bit line BL in the first direction X. However, the arrangement relationship between the second fence pattern FN2_5 and the conductive layers 151, 153, and 155 of the bit line BL is not limited thereto, and may be varied. For example, the second fence pattern FN2_5 may extend further in the third direction Z toward a word line capping layer 134 to overlap at least a portion of the first conductive layer 151 of the bit line BL in the first direction X.

Even according to the example embodiment according to FIGS. 8 to 10, it may be advantageous in terms of parasitic capacitance between the bit lines BLs as the second fence patterns FN2_3, FN2_4, and FN2_5 including an insulating material having the relatively low dielectric constant overlap at least a portion of the third conductive layer 155 including the material having the lowest resistance among the conductive layers 151, 153, and 155 of the bit lines BLs in the first direction X.

Figure 11:
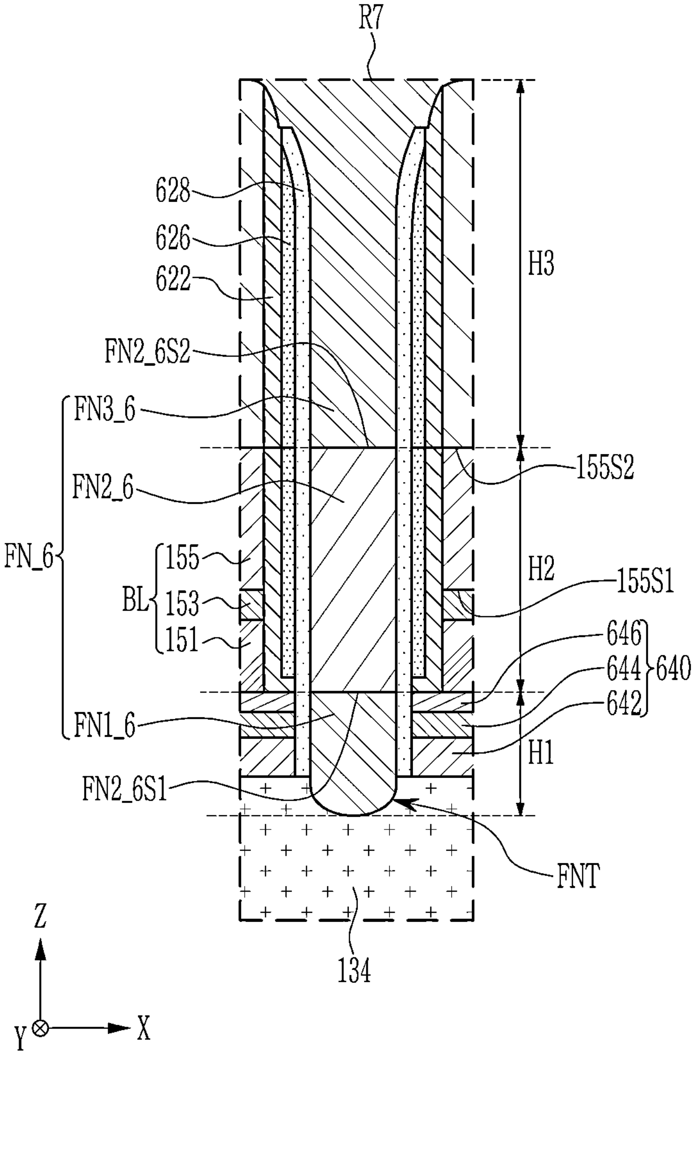
Figure 12:
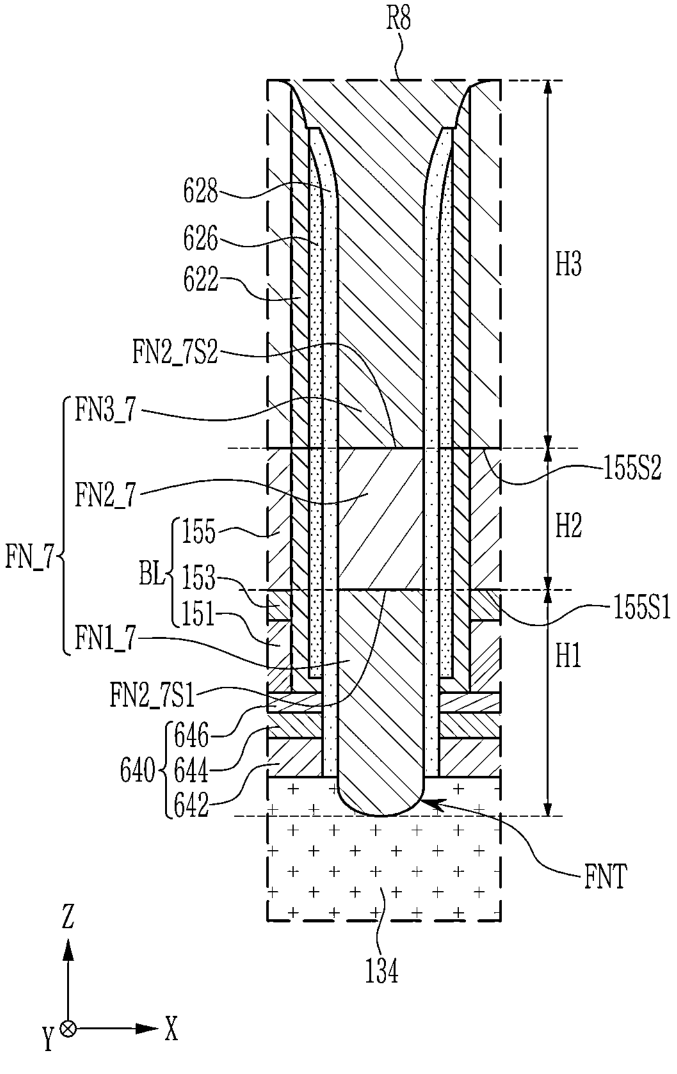

Fence patterns FN_6 and FN_7 according to the example embodiments illustrated in FIGS. 11 and 12 differ from the fence pattern FN according to the example embodiment illustrated in FIG. 5 in that the configuration of the fence pattern FN and the arrangement relationship with the conductive layers 151, 153, and 155 of the bit line BL are different. That is, according to the example embodiments illustrated in FIGS. 11 and 12, the fence patterns FN_6 and FN_7 may further include third fence patterns FN3_6 and FN3_7, respectively.

For example, referring to FIG. 11, the fence pattern FN_6 may include a first fence pattern FN1_6, a second fence pattern FN2_6, and a third fence pattern FN3_6 stacked sequentially within a fence pattern trench FNT.

The first fence pattern FN1_6 and the third fence pattern FN3_6 may include the second material described above, and the second fence pattern FN2_6 may comprise the first material described above. For example, the first material may include silicon oxide, or a low dielectric constant (low-k) material, such as SiBN, SiCN, SiOCH, and SiOC, having a lower dielectric constant than silicon oxide, and the second material may include silicon nitride, silicon nitric oxide, a combination thereof. However, the first material and the second material are not limited thereto and may be varied.

The first fence pattern FN1_6 may have a first length H1 along the third direction Z, the second fence pattern FN2_6 may have a second length H2 along the third direction Z, and the third fence pattern FN3_6 may have a third length H3 along the third direction Z.

In the present example embodiment, the first length H1, the second length H2, and the third length H3 may be different. For example, the first length H1 may be smaller than the second length H2 and the third length H3, and the second length H2 may be smaller than the third length H3. That is, the first length H1 may be the smallest, and the third length H3 may be the largest. However, the size relationships of the first length H1, the second length H2, and the third length H3 are not limited to and may be varied.

The first fence pattern FN1_6 may overlap a word line capping layer 134 and an insulation layer 640 in the first direction X, the second fence pattern FN2_6 may overlap the conductive layers 151, 153, and 155 of the bit line BL in the first direction X, and the third fence pattern FN3_6 may overlap a bit line capping layer 158 in the first direction X.

A lower surface FN2_6S1 of the second fence pattern FN2_6 may be located at the substantially same level as the lower surface of the first conductive layer 151 of the bit line BL, and the upper surface FN2_6S2 of the second fence pattern FN2_6 may be located at the substantially same level as the top surface 155S2 of the third conductive layer 155 of the bit line BL. Accordingly, the second fence pattern FN2_6 may overlap all of the conductive layers 151, 153, and 155 of the bit line BL in the first direction X.

The example embodiment illustrated in FIG. 12 is different from the example embodiment illustrated in FIG. 11 in that a second fence pattern FN2_7 overlaps some of conductive layers 151, 153, and 155 of a bit line BL in the first direction X.

That is, referring to FIG. 12, the first fence pattern FN1_7 may overlap the first conductive layer 151 and the second conductive layer 153 of the bit line BL in the first direction X. The second fence pattern FN2_7 may not overlap the first conductive layer 151 and the second conductive layer 153 of the bit line BL in the first direction X, and may overlap the third conductive layer 155 of the bit line BL in the first direction X.

That is, a lower surface FN2_7S1 of the second fence pattern FN2_7 may be located at the substantially same level as a lower surface 155S1 of the third conductive layer 155 of the bit line BL, and a top surface FN2_7S2 of the second fence pattern FN2_7 may be located at the substantially same level as a top surface 155S2 of the third conductive layer 155 of the bit line BL.

Also, according to the example embodiment illustrated in FIG. 12, the first fence pattern FN1_7 may have a first length H1 along the third direction Z, the second fence pattern FN2_7 may have a second length H2 along the third direction Z, and the third fence pattern FN3_7 may have a third length H3 along the third direction Z.

In the present example embodiment, the first length H1, the second length H2, and the third length H3 may be different. For example, the first length H1 may be larger than the second length H2 and smaller than the third length H3. The second length H2 may be smaller than the first length H1 and the third length H3. That is, the second length H2 may be the smallest, and the third length H3 may be the largest. However, the size relationships of the first length H1, the second length H2, and the third length H3 are not limited to and may be varied.

The example embodiments according to FIGS. 11 and 12 may have substantially the same effect as that according to the embodiment illustrated in FIG. 5.

Fence patterns FN_8, FN_9, FN_10, and FN_11 according to the example embodiments illustrated in FIGS. 13 to 16 may have different configurations and shapes compared to the fence pattern FN according to the embodiment illustrated in FIG. 5.

Figure 13:
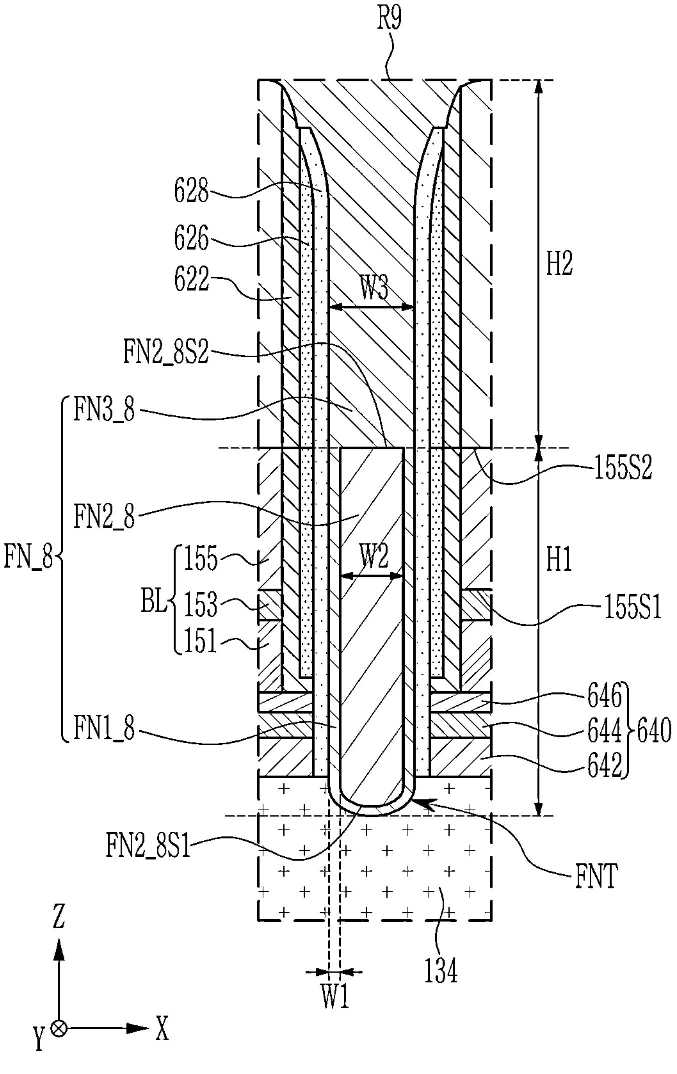

The fence patterns FN_8 according to the example embodiment illustrated in FIG. 13 include a first fence pattern FN1_8 conformally located along a lateral surface and a bottom surface of a fence pattern trench FNT, a second fence pattern FN2_8 whose lower surface and a lateral surface are surrounded by the first fence pattern FN1_8, and a third fence pattern FN3_8 located on the first fence pattern FN1_8 and the second fence pattern FN2_8.

In the present example embodiment, the first fence pattern FN1_8 and the third fence pattern FN3_8 may include the second material described above, and the second fence pattern FN2_8 may include the first material described above. For example, the first material may include silicon oxide, or a low dielectric constant (low-k) material, such as SiBN, SiCN, SiOCH, and SiOC, having a lower dielectric constant than silicon oxide, and the second material may include silicon nitride, silicon nitric oxide, or a combination thereof. However, the first material and the second material are not limited thereto and may be varied.

The lower surface FN2_8S1 of the second fence pattern FN2_8 is located at a lower level than a top surface of the word line capping layer 134 and a lower surface 155S1 of a third conductive layer 155 of the bit line BL, and may penetrate the insulation layer 640. A top surface FN2_8 of the second fence pattern FN2_8 may be located at the substantially same level as a top surface 155S2 of the third conductive layer 155 of the bit line BL.

Accordingly, the second fence pattern FN2_8 may overlap all of the conductive layers 151, 153, and 155 of the bit line BL in the first direction X. However, the overlapping relationship between the second fence pattern FN2_8 and the conductive layers 151, 153, and 155 of the bit line BL is not limited to, and may be varied. For example, the second fence pattern FN2_8 and some of the conductive layers 151, 153, and 155 of the bit line BL may overlap in the first direction X.

In the present example embodiment, the first fence pattern FN1_8 may have a first width W1 in the first direction X, the second fence pattern FN2_8 may have a second width W2 in the first direction X, and the third fence pattern FN3_8 may have a third width W3 in the first direction X.

Here, the third width W3 in the first direction X of the third fence pattern FN3_8 may mean a width along the first direction X of the third fence pattern FN3_8 that overlaps the first fence pattern FN1_8 and the second fence pattern FN2_8 in the third direction Z.

In the present example embodiment, the first width W1, the second width W2, and the third width W3 may be different. For example, the first width W1 may be smaller than the second width W2 and the third width W3, and the second width W2 may be smaller than the third width W3. That is, the first width W1 may be the smallest and the third width W3 may be the largest. However, the size relationships of the first width W1, the second width W2, and the third width W3 may be varied.

Also, in the present example embodiment, the first length H1 of the second fence pattern FN2_8 along the third direction Z may be different from the second length H2 along the third direction Z of the third fence pattern FN3_8. For example, the first length H1 may be smaller than the second length H2. However, the size relationships of the first length H1 and the second length H2 are not limited to and may be varied.

Figure 14:
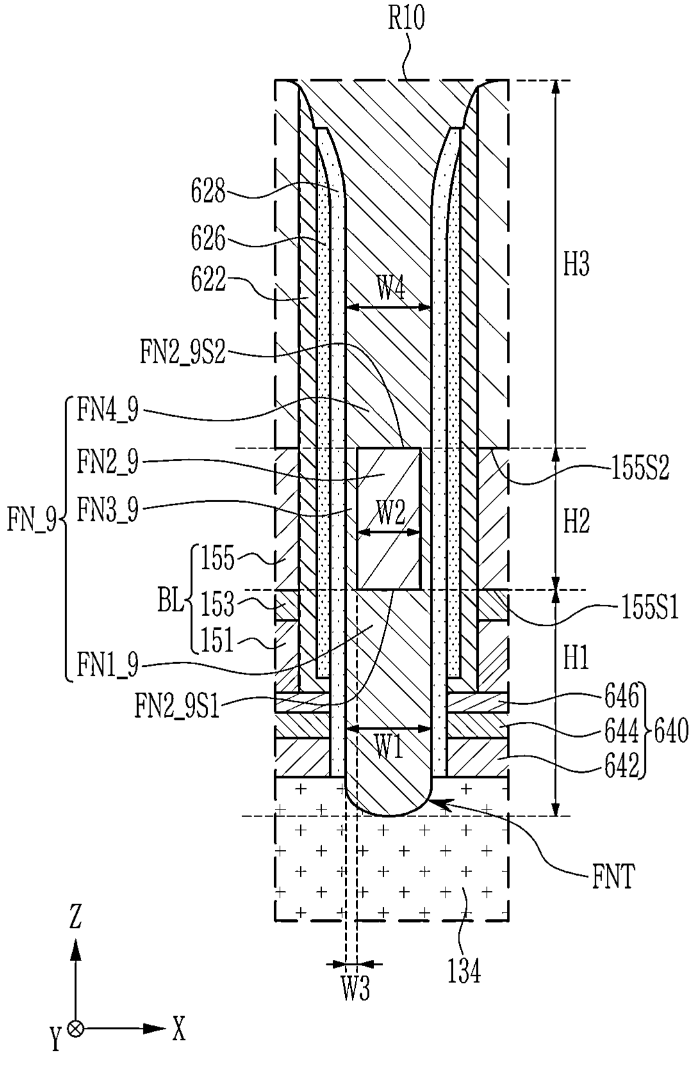

The fence pattern FN_9 according to the example embodiment illustrated in FIG. 14 includes a first fence pattern FN1_9 located on the bottom surface of the fence pattern trench FNT, a second fence pattern FN2_9 located on the first fence pattern FN1_9, a third fence pattern FN3_9 located on the first fence pattern FN1_9 and conformally located on a lateral surface of the fence pattern trench FNT on the lateral surface of the second fence pattern FN2_9, and a fourth fence pattern FN4_9 located on the second fence pattern FN2_9 and the third fence pattern FN3_9.

In the present example embodiment, the first fence pattern FN1_9, the third fence pattern FN3_9, and the fourth fence pattern FN4_9 may include the second material described above, and the second fence pattern FN2_9 may include the first material described above. For example, the first material may include silicon oxide, or a low dielectric constant (low-k) material (e.g., SiBN, SiCN, SiOCH, or SiOC) having a lower dielectric constant than silicon oxide, and the second material may include silicon nitride, silicon nitric oxide, a combination thereof. However, the first material and the second material are not limited thereto and may be varied.

A top surface of the first fence pattern FN1_9 directly contacts the second fence pattern FN2_9 and the third fence pattern FN3_9, and a lower surface of the first fence pattern FN1_9 is located at a lower level than a top surface of a word line capping layer 134, and may penetrate an insulation layer 640.

The first fence pattern FN1_9 may overlap the insulation layer 640 and a first conductive layer 151 and a second conductive layer 153 of the bit line BL in the first direction X.

A lower surface FN2_9S1 of the second fence pattern FN2_9 may be located substantially at the same level as a lower surface 155S1 of the third conductive layer 155 of the bit line BL, and a top surface FN2_9S2 of the second fence pattern FN2_9 may be located substantially at the same level as a top surface 155S2 of the third conductive layer 155 of the bit line BL.

Accordingly, the second fence pattern FN2_9 may not overlap the first conductive layer 151 and the second conductive layer 153 of the bit line BL in the first direction X, and may overlap the third conductive layer 155 of the bit line BL in the first direction X.

The third fence pattern FN3_9 is directly in contact with a lateral surface of the second fence pattern FN2_9, and may overlap the third conductive layer 155 of the bit line BL in the first direction X.

The fourth fence pattern FN4_9 is located on the second fence pattern FN2_9 and the third fence pattern FN3_9, and may be directly in contact with the second fence pattern FN2_9 and the third fence pattern FN3_9. The fourth fence pattern FN4_9 may not overlap the conductive layers 151, 153, and 155 of the bit line BL in the first direction X, and may overlap the bit line capping layer 158 in the first direction X.

In the present example embodiment, the first fence pattern FN1_9 may have a first width W1 in the first direction X, the second fence pattern FN2_9 may have a second width W2 in the first direction X, the third fence pattern FN3_9 may have a third width W3 in the first direction X, and the fourth fence pattern FN4_9 may have a fourth width W4 in the first direction X.

Here, the fourth width W4 of the fourth fence pattern FN4_9 in the first direction X may mean a width of the fourth fence pattern FN4_9 along the first direction X that overlaps the first fence pattern FN1_9, the second fence pattern FN2_9, and the third fence pattern FN3_9 in the third direction Z.

In the present example embodiment, at least some of the first width W1, the second width W2, the third width W3, and the fourth width W4 may be different. For example, the first width W1 may be larger than the second width W2 and the third width W3, and substantially equal to the fourth width W4.

The second width W2 may be smaller than the first width W1 and the fourth width W4, and may be larger than the third width W3. However, the size relationships of the first width W1, the second width W2, the third width W3, and the fourth width W4 may be varied.

Also, in the present example embodiment, the first length H1 of the first fence pattern FN1_9 along the third direction Z may be larger than the second length H2 of the second fence pattern FN2_9 along the third direction Z, and may be smaller than the third length H3 of the fourth fence pattern FN4_9 along the third direction Z. The second length H2 of the third fence pattern FN3_9 along the third direction Z may be smaller than the first length H1 of the first fence pattern FN1_9 along the third direction Z, and may be substantially the same as the second length H2 of the second fence pattern FN2_9 along the third direction Z. However, the size relationships of the first length H1, the second length H2, and the third length H3 are not limited to and may be varied.

The example embodiments according to FIGS. 13 and 14 may also have substantially the same effect as that according to the embodiment illustrated in FIG. 5.

Figure 15:
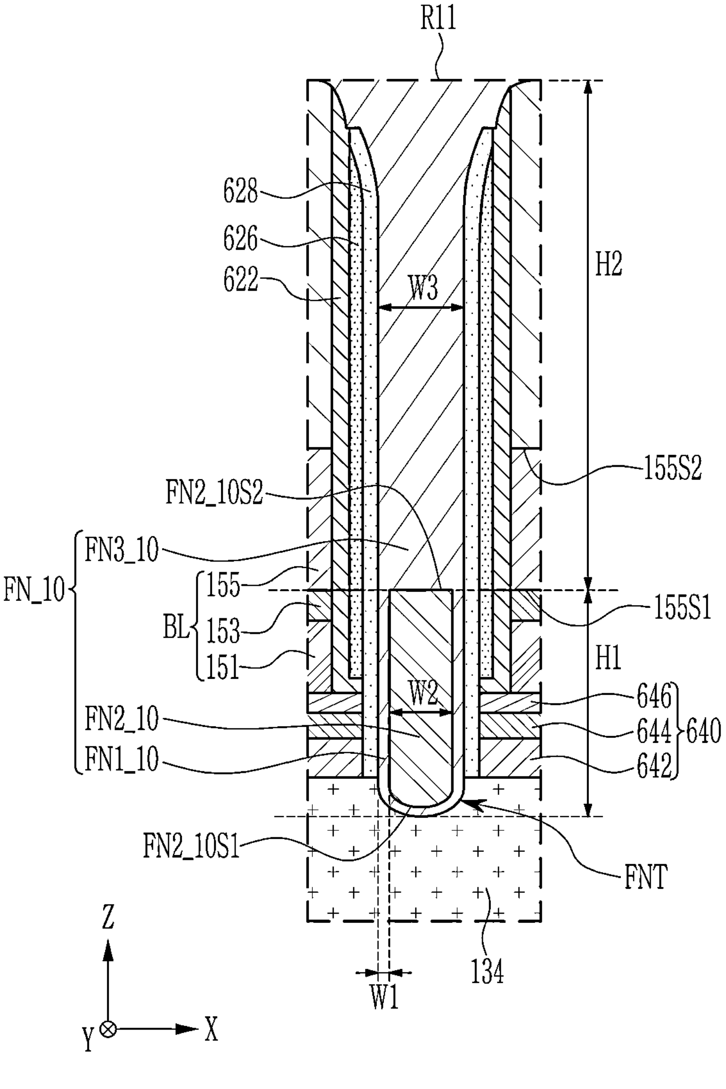

A fence pattern FN_10 according to the example embodiment illustrated in FIG. 15 may include a first fence pattern FN1_10 conformally located along a lateral surface and a bottom surface of a fence pattern trench FNT, a second fence pattern FN2_10 whose lower surface and lateral surface are surrounded by the first fence pattern FN1_10, and a third fence pattern FN3_10 located on the first fence pattern FN1_10 and the second fence pattern FN2_10.

In the present example embodiment, the first fence pattern FN1_10 and the third fence pattern FN3_10 may include the first material described above, and the second fence pattern FN2_10 may include the second material described above. For example, the first material may include silicon oxide, or a low dielectric constant (low-k) material (e.g., SiBN, SiCN, SiOCH, or SiOC) having a lower dielectric constant than silicon oxide, and the second material may include silicon nitride, silicon nitric oxide, a combination thereof. However, the first material and the second material are not limited thereto and may be varied.

A lower surface FN2_10S1 of the second fence pattern FN2_10 is located at a lower level than a top surface of a word line capping layer 134 and a lower surface 155S1 of a third conductive layer 155 of a bit line BL, and may penetrate an insulation layer 640.

A top surface FN2_10S2 of the second fence pattern FN2_10 may be located substantially at the same level as a lower surface 155S1 of the third conductive layer 155 of a bit line BL. Accordingly, the second fence pattern FN2_10 may overlap the first conductive layer 151 and the second conductive layer 153 of the bit line BL in the first direction X, and may not overlap the third conductive layer 155 of the bit line BL in the first direction X.

The third fence pattern FN3_10 extends in the third direction Z toward the word line capping layer 134, and may be directly in contact with the first fence pattern FN1_10 and the second fence pattern FN2_10. A lower surface of the third fence pattern FN3_10 may be located substantially at the same level as a lower surface 155S1 of the third conductive layer 155 of the bit line BL.

Accordingly, the third fence pattern FN3_10 may not overlap the first conductive layer 151 and the second conductive layer 153 of the bit line BL in the first direction X, and the third fence pattern FN3_10 may overlap the entire third conductive layer 155 of the bit line BL in the first direction X. However, the arrangement relationship of the third fence pattern FN3_10 and the third conductive layer 155 of the bit line BL is not limited thereto, and may be varied. For example, the third fence pattern FN3_10 may overlap a portion of the third conductive layer 155 of the bit line BL in the first direction X.

In the present example embodiment, the first fence pattern FN1_10 may have a first width W1 in the first direction X, the second fence pattern FN2_10 may have a second width W2 in the first direction X, and the third fence pattern FN3_10 may have a third width W3 in the first direction X.

Here, the third width W3 of the third fence pattern FN3_10 in the first direction X may mean a width along the first direction X of the third fence pattern FN3_10 that overlaps the first fence pattern FN1_10 and the second fence pattern FN2_10 in the third direction Z.

In the present example embodiment, the relationship between the first width W1, the second width W2, and the third width W3 may be substantially the same as the relationship between the first width W1 of the first fence pattern FN1_8 in the first direction X, the second width W2 of the second fence pattern FN2_8 in the first direction X, and the third width W3 of the third fence pattern FN3_8 in the first direction X according to the embodiment illustrated in FIG. 13.

Furthermore, in the present example embodiment, the first length H1 of the second fence pattern FN2_10 along the third direction Z may be different from the second length H2 of the third fence pattern FN3_10 along the third direction Z. For example, the first length H1 may be smaller than the second length H2. However, the size relationships of the first length H1 and the second length H2 are not limited to and may be varied.

The example embodiment according to FIG. 15 may have substantially the same effect as that according to the embodiment illustrated in FIG. 10.

Figure 16:
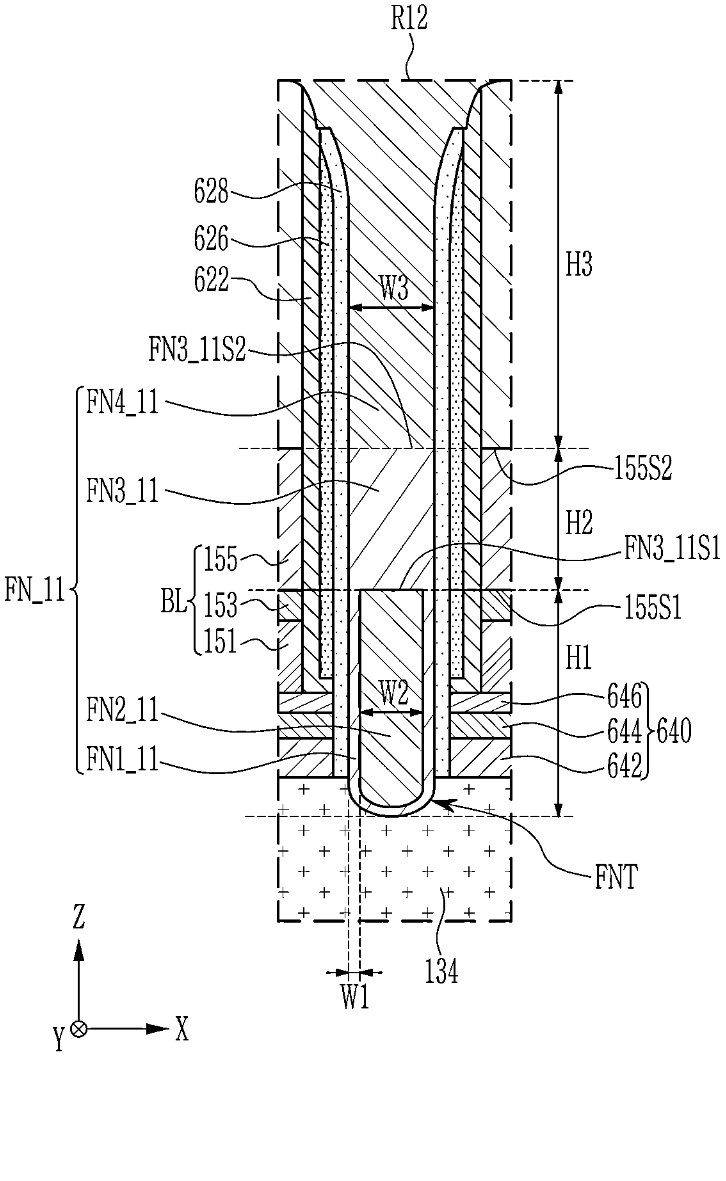

A fence pattern FN_11 according to the example embodiment illustrated in FIG. 16 is different from the fence pattern FN_10 according to the example embodiment illustrated in FIG. 15 in that a fourth fence pattern FN4_11 is further included.

For example, the fence pattern FN_11 may include a first fence pattern FN1_11 located conformally along a lateral surface and a bottom surface of a fence pattern trench FNT, a second fence pattern FN2_11 whose lower surface and a lateral surface are surrounded by the first fence pattern FN1_11, a third fence pattern FN3_11 located on the first fence pattern FN1_11 and the second fence pattern FN2_11, and a fourth fence pattern FN4_11 located on the third fence pattern FN3_11.

In the present example embodiment, the first fence pattern FN1_11 and the third fence pattern FN3_11 may include the first material described above, and the second fence pattern FN2_11 and the fourth fence pattern FN4_11 may include the second material described above. For example, the first material may include silicon oxide, or a low dielectric constant (low-k) material (e.g., SiBN, SiCN, SiOCH, or SiOC) having a lower dielectric constant than silicon oxide, and the second material may include silicon nitride, silicon nitric oxide, a combination thereof. However, the first material and the second material are not limited thereto and may be varied.

The description of the first fence pattern FN1_11 and the second fence pattern FN2_11 according to the present example embodiment is omitted because the description of the first fence pattern FN1_10 and the second fence pattern FN2_10 according to the example embodiment illustrated in FIG. 15 may be applied substantially the same.

A lower surface FN3_11S1 of the third fence pattern FN3_11 may be located substantially at the same level as a lower surface 155S1 of a third conductive layer 155 of the bit line BL, and a top surface FN3_11S2 of the third fence pattern FN3_11 may be located substantially at the same level as a top surface 155S2 of the third conductive layer 155 of the bit line BL. Accordingly, the third fence pattern FN3_11 may not overlap the first conductive layer 151 and the second conductive layer 153 of the bit line BL in the first direction X, and the third fence pattern FN3_11 may overlap the entire third conductive layer 155 of the bit line BL in the first direction X.

The fourth fence pattern FN4_11 is located on the third fence pattern FN3_11 and may be directly in contact with the third fence pattern FN3_11. Further, the fourth fence pattern FN4_11 may overlap a bit line capping layer 158 in the first direction X, and may not overlap the conductive layers 151, 153, and 155 of the bit line BL.

In the present example embodiment, the first fence pattern FN1_11 has a first width W1 in the first direction X, the second fence pattern FN2_11 has a second width W2 in the first direction X, and the third fence pattern FN3_11 and the fourth fence pattern FN4_11 may have a third width W3 in the first direction X. Here, the third width W3 of the third fence pattern FN3_11 and the fourth fence pattern FN4_11 in the first direction X may mean a width along the first direction X of the fourth fence pattern FN4_11 that overlaps the first fence pattern FN1_11 and the second fence pattern FN2_11 in the third direction Z.

In the present example embodiment, at least some of the first width W1, the second width W2, and the third width W3 may be different. For example, the first width W1 may be smaller than the second width W2 and the third width W3, and the second width W2 may be larger than the first width W1 and be smaller than the third width W3. However, the size relationships of the first width W1, the second width W2, and the third width W3 may be varied.

Also, in the present example embodiment, the second fence pattern FN2_11 may have a first length H1 along the third direction Z, the third fence pattern FN3_11 may have a second length H2 along the third direction Z, and the fourth fence pattern FN4_11 may have a third length H3 along the third direction Z.

In the present example embodiment, the first length H1, the second length H2, and the third length H3 may be different. For example, the first length H1 may be larger than the second length H2 and smaller than the third length H3. The second length H2 may be smaller than the first length H1 and the third length H3. That is, the second length H2 may be the smallest, and the third length H3 may be the largest. However, the size relationships of the first length H1, the second length H2, and the third length H3 are not limited to and may be varied.

The example embodiment according to FIG. 16 may have substantially the same effect as that according to the embodiment illustrated in FIG. 12.

Hereinafter, a method of manufacturing a semiconductor device according to an example embodiment will be described with reference to FIGS. 17 to 30. Configurations that are identical to those of the previously described example embodiment will be referred to by the same reference numerals, and redundant descriptions will be omitted or simplified, and differences will be emphasized.

FIGS. 17 to 30 are plan views and cross-sectional views illustrating a method of manufacturing a semiconductor device according to an example embodiment.

For example, FIGS. 17, 20, 23, 26, and 29 are plan views to illustrate a method of manufacturing a semiconductor device according to an example embodiment, and FIGS. 18, 19, 21, 22, 24, 25, 27, 28, and 30 are cross-sectional views cut along cut lines of the corresponding plan views, respectively.

In the following, the description of the method of forming the device separation layer 112, the word line structures WLS, the direct contacts DC, and the bit line structures BLS will be simplified, and a method of forming the buried contact BC and the fence pattern FN will be mainly described.

Figure 17:
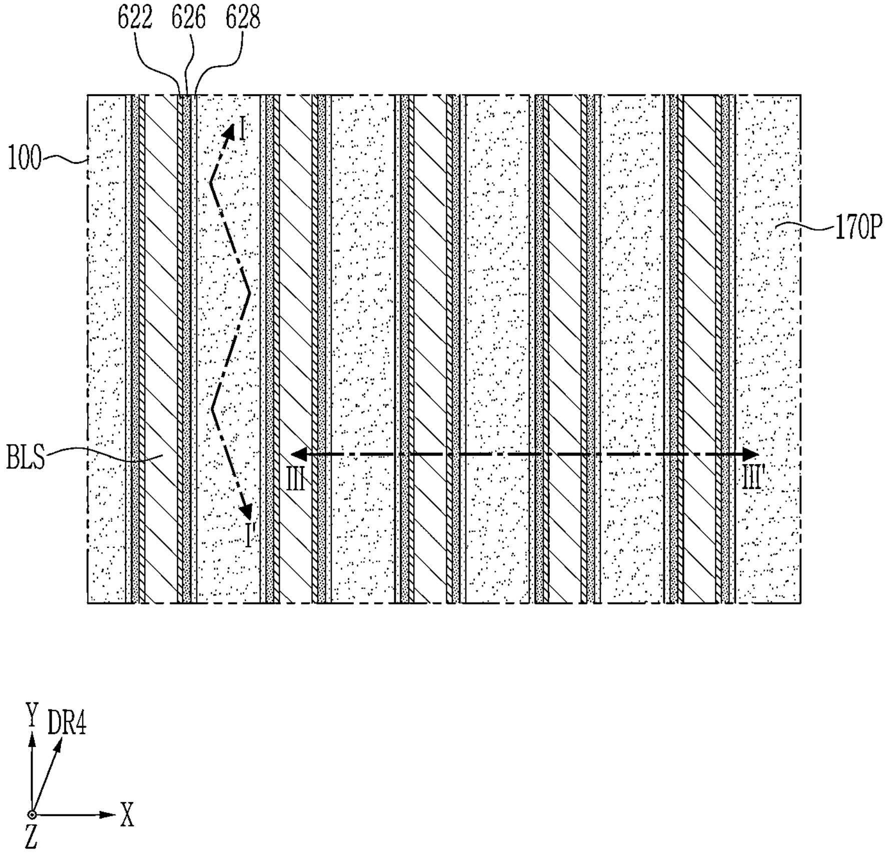
FIGS. 17 to 30 are plan views and cross-sectional views illustrating a method of manufacturing a semiconductor device according to an example embodiment.
Figure 18:
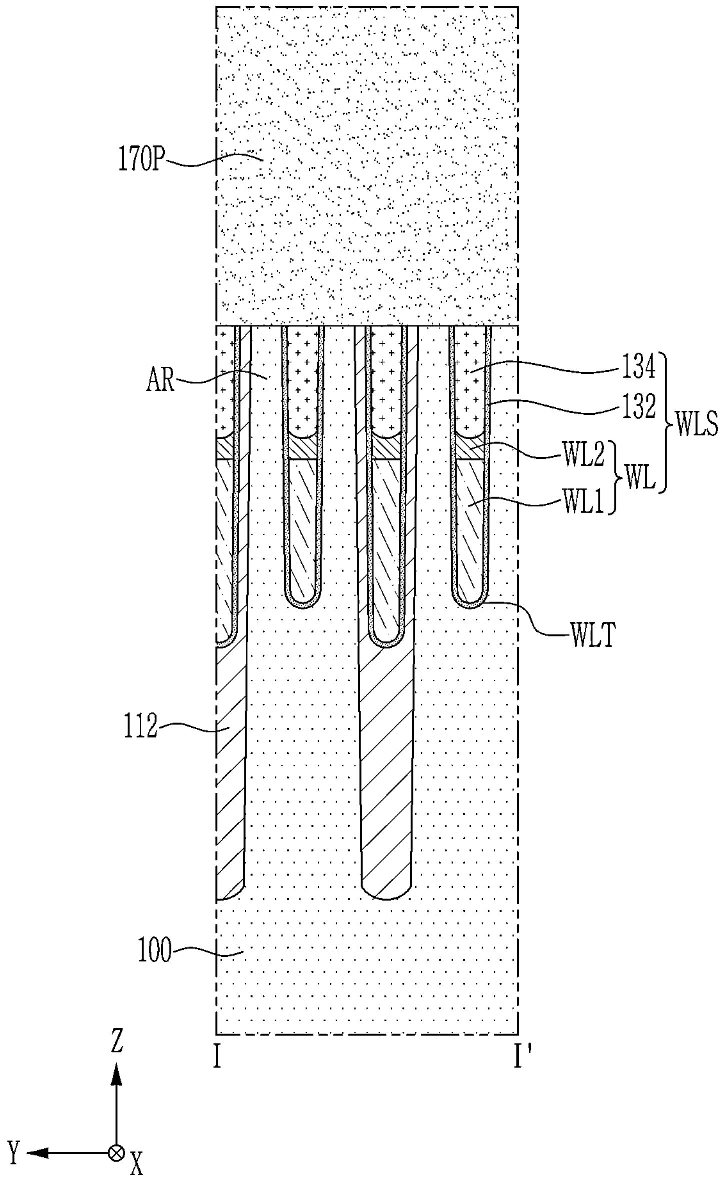
Figure 19:
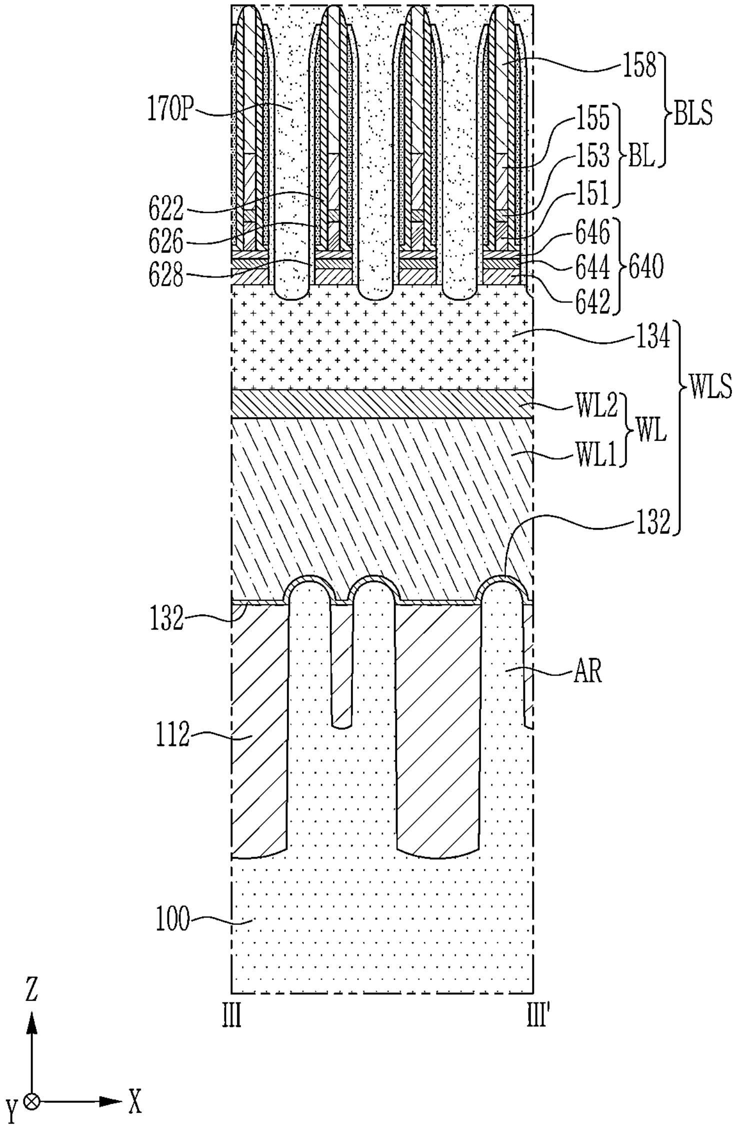

Referring to FIGS. 17 to 19, a trench may be formed in a substrate 100 for separating a plurality of devices, and a device separation layer 112 may be formed to fill the trench.

A word line trench WLT may then be formed in the substrate 100, and a word line structure WLS may be formed within the word line trench WLT. That is, the word line structure WLS may have a form that is embedded within the substrate 100. A portion of the word line trench WLT may be located on the active region AR, and another portion may be located on the device separation layer 112.

A direct contact (see "DC" in FIG. 3) connecting the active region AR of the substrate 100 to the bit line BL may then be formed.

A bit line BL that includes a first conductive layer 151, a second conductive layer 153, and a third conductive layer 155 stacked sequentially on the substrate 100 and the direct contact DC may then be formed. Next, a bit line capping layer 158 may be formed on the bit line BL.

Subsequently, a spacer structure 620 extending along a lateral surface of the bit line structure BLS in an approximate third direction Z and including a first spacer 622, a second spacer 624, a third spacer 626, and a fourth spacer 628 may be formed.

A conductive material layer 170P may then be formed on the substrate 100. The conductive material layer 170P may cover a top surface of the word line capping layer 134 and a top surface of the active region AR.

Further, the conductive material layer 170P may be formed between the bit line structures BLS spaced apart in the first direction X. The conductive material layer 170P extends along the second direction Y between the bit line structures BLS and may be formed in a planar line shape. That is, the conductive material layer 170P may extend along the second direction Y in parallel with the in-plane bit line structure BLS.

The conductive material layer 170P may be in direct contact with the lateral surface of the spacer structure 620. For example, the conductive material layer 170P may be in direct contact with a first spacer 622 and a fourth spacer 628. A top surface of the conductive material layer 170P may be located substantially at the same level as a top surface of the bit line capping layer 158.

A lower surface of the conductive material layer 170P formed between the bit line structures BLS may be directly in contact with the top surface of the word line capping layer 134.

The conductive material layer 170P may include a conductive material. For example, the conductive material layer 170P may include, but is not limited to, polysilicon doped with impurities, and the conductive material may be varied.

Figure 20:
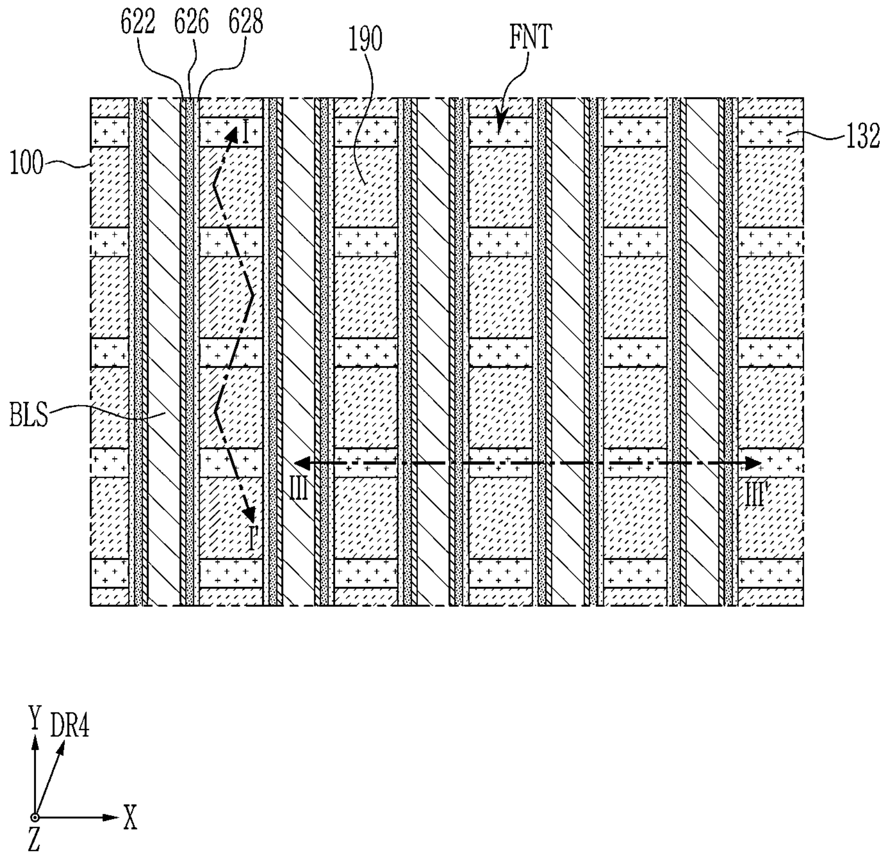
Figure 21:
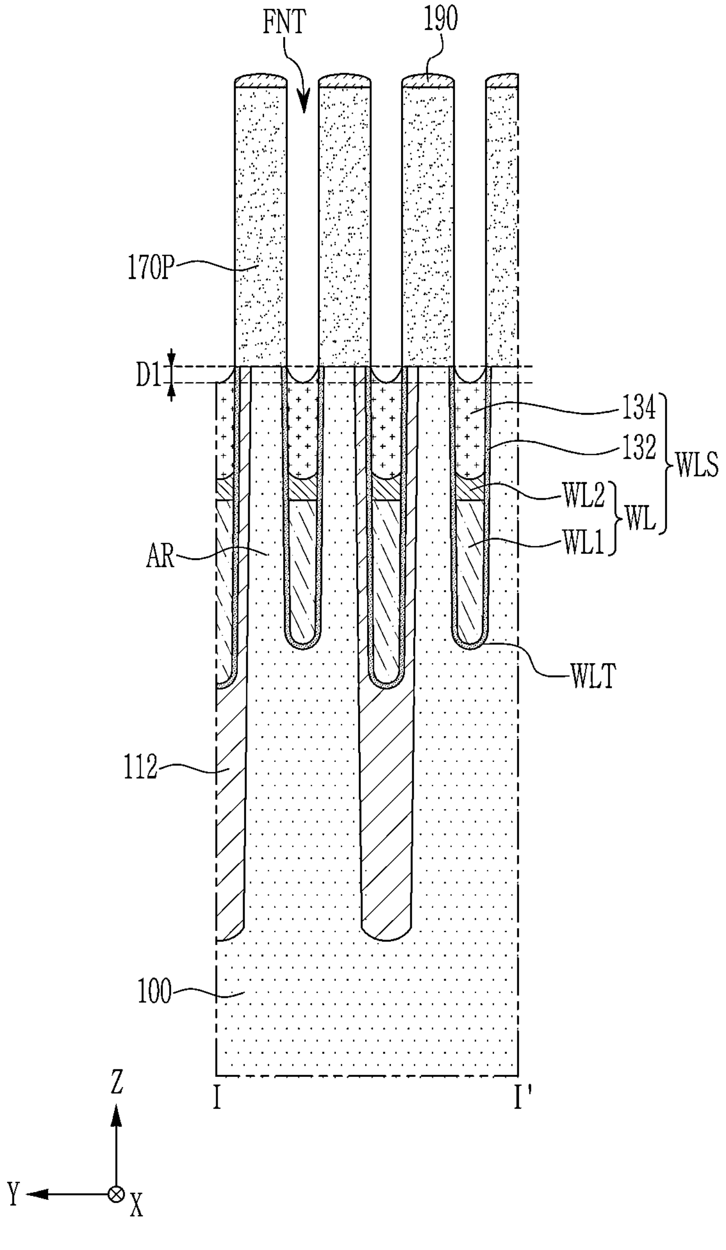
Figure 22:
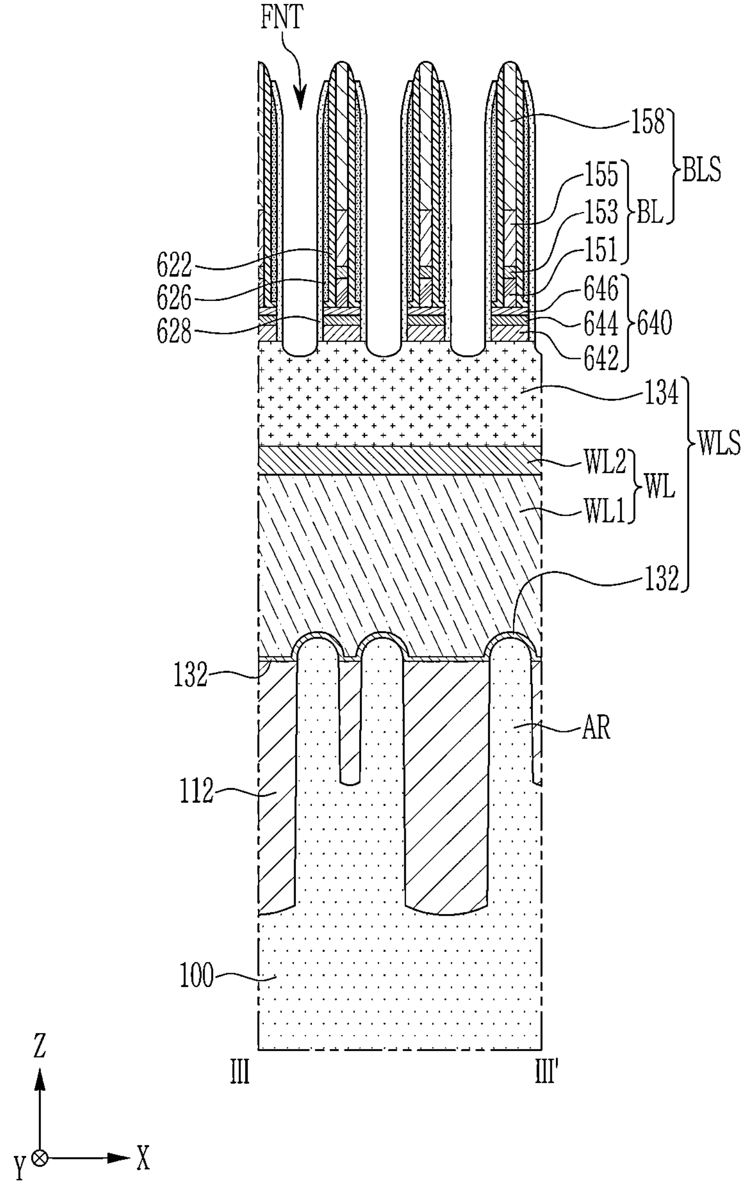

Then, referring to FIGS. 20 to 22, a hard mask layer may be formed on the conductive material layer 170P. By patterning the hard mask layer by using photo and etch processes, a hard mask pattern 190 may be formed.

As the conductive material layer 170P is etched by using the hard mask pattern 190, a fence pattern trench FNT may be formed that exposes the top surface of the word line capping layer 134. The conductive material layer 170P may configure the lateral surface of the fence pattern trench FNT, and the top surface of the word line capping layer 134 may configure the bottom surface of the fence pattern trench FNT. The planar, line-shaped conductive material layers 170P may be separated from each other by the fence pattern trenches FNTs. The fence pattern trench FNT may be formed between the plurality of bit lines BLs and between the plurality of buried contacts BCs.

The conductive material layer 170P located between the bit line structures BLS may be etched by using the bit line capping layer 158, and the spacer structures 620 located on both sides of each of the bit line structures BLS as etch masks.

Accordingly, a fence pattern trench FNT may be formed between the bit line structures BLS. Here, the spacer structure 620 and the insulation layer 640 may configure the lateral surface of the fence pattern trench FNT, and the top surface of the word line capping layer 134 may form the bottom surface of the fence pattern trench FNT.

Further, as the conductive material layer 170P is etched, the top surface of the bit line structure BLS may be exposed.

To reduce or prevent the conductive material layer 170P from remaining on the word line capping layer 134 during the process operation of etching the conductive material layer 170P by using the hard mask pattern 190, the bit line capping layer 158, and the spacer structure 620, the word line capping layer 134 is over-etched, so that the word line capping layer 134 may be recessed from the top surface toward the lower surface. That is, in the process operation of forming the fence pattern trench FNT that exposes the top surface of the word line capping layer 134, the word line capping layer 134 may have a shape that is concave from the top surface toward the lower surface by the fence pattern trench FNT. Accordingly, the fence pattern trench FNT may be formed deeper than the thickness along the third direction Z of the conductive material layer 170P.

Additionally, in the process operation of forming the fence pattern trench FNT that exposes the top surface of the word line capping layer 134, the insulation layer 640 may be etched together.

Accordingly, the top surface of the word line capping layer 134, which configures the bottom surface of the fence pattern trench FNT, may include a curved surface. However, the shape of the bottom surface of the fence pattern trench FNT recessed toward the word line capping layer 134 is not limited to, and may be varied. For example, the bottom surface of the fence pattern trench FNT may be recessed toward the word line capping layer 134 in a rectangular shape or a shape that decreases in width toward the substrate 100. Accordingly, the shape of the lower surface of the fence pattern FN may also be varied.

In one example embodiment, a depth D1 of the word line capping layer 134 recessed from the top surface of the word line capping layer 134 toward the lower surface may be about 40 Å to 50 Å.

When the depth D1 of the word line capping layer 134 recessed from the top surface of the word line capping layer 134 toward the lower surface has the above numerical value range, in the process operation of etching the conductive material layer 170P, it is possible to mitigate or prevent a conductive material layer from remaining on the word line capping layer 134.

Figure 23:
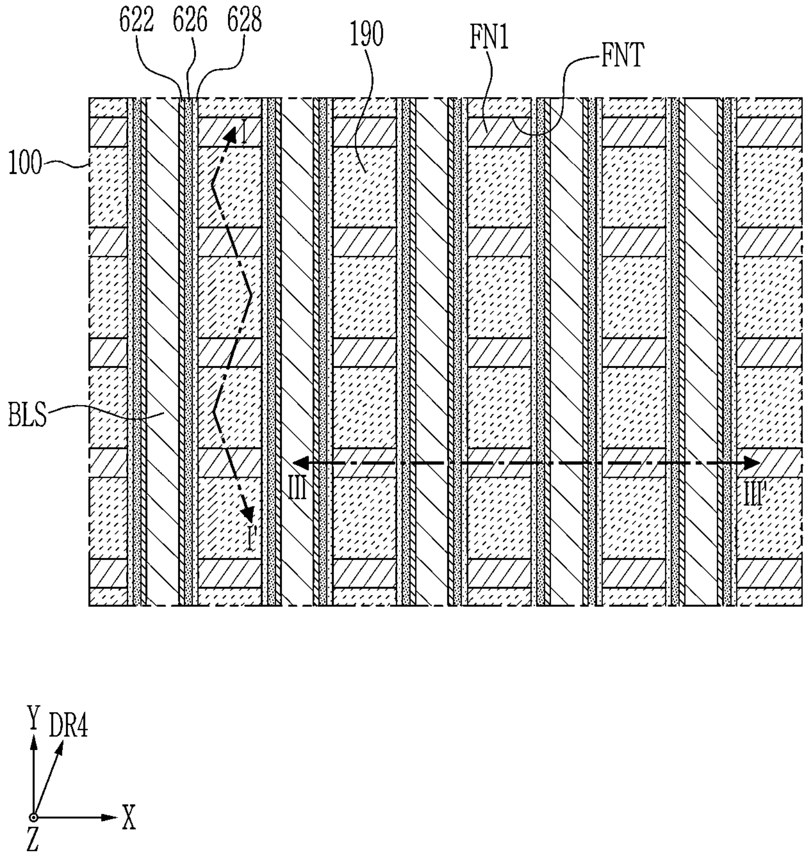
Figure 24:
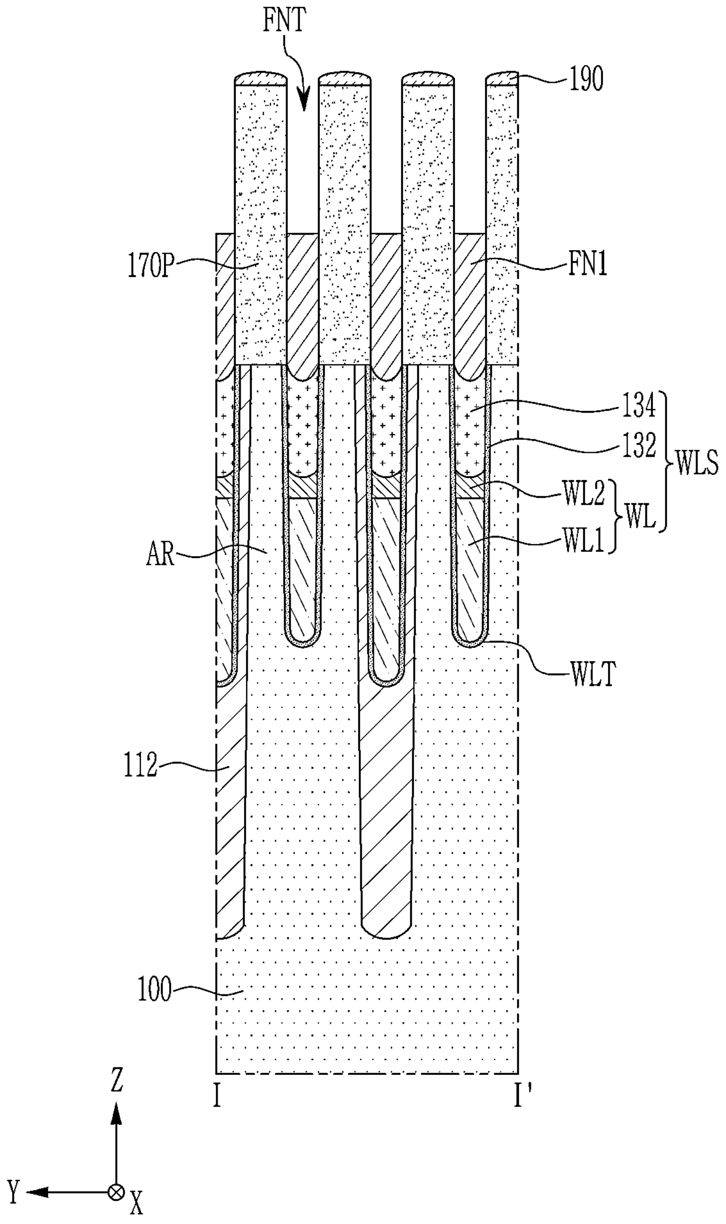
Figure 25:
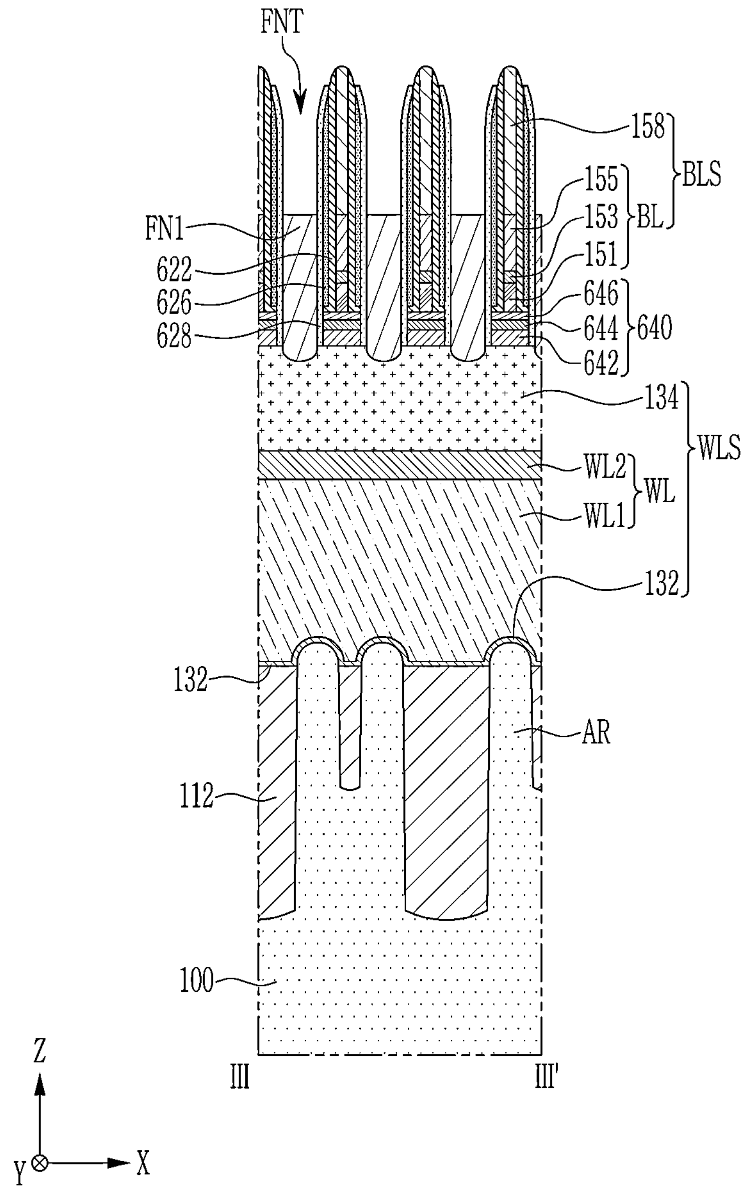

Then, referring to FIGS. 23 to 25, a first fence pattern FN1 may be formed within the fence pattern trench FNT.

A lateral surface of the first fence pattern FN1 is directly in contact with the conductive material layer 170P, and a lower surface of the first fence pattern FN1 may be directly in contact with the word line capping layer 134. Additionally, the lateral surface of the first fence pattern FN1 may be directly in contact with the spacer structure 620.

The first fence pattern FN1 may be formed to fill a portion of the fence pattern trench FNT. That is, the first fence pattern FN1 may be formed to overlap at least a portion of the first conductive layer 151, the second conductive layer 153, and the third conductive layer 155 of the bit line BL in the first direction X.

For example, the first fence pattern FN1 may be formed such that the top surface of the first fence pattern is substantially at the same level as the top surface of the third conductive layer 155 of the bit line BL. In another example, the top surface of the first fence pattern FN1 may be formed to be located at a level between the top surface and the lower surface of the third conductive layer 155 of the bit line BL.

The process operation of forming the first fence pattern FN1 in the fence pattern trench FNT may include forming the top surface of the mask pattern 190 and a first fence pattern material layer in the fence pattern trench FNT, and then etching a portion of the first fence pattern material layer.

The first fence pattern material layer may include an insulating material layer having a low dielectric constant. For example, the first fence pattern material layer may include silicon oxide, or low dielectric constant (low-k) materials (e.g., SiBN, SiCN, SiOCH, or SiOC), that have a lower dielectric constant than silicon oxide. However, the first fence pattern material layer is not limited thereto and may be varied.

Figure 26:
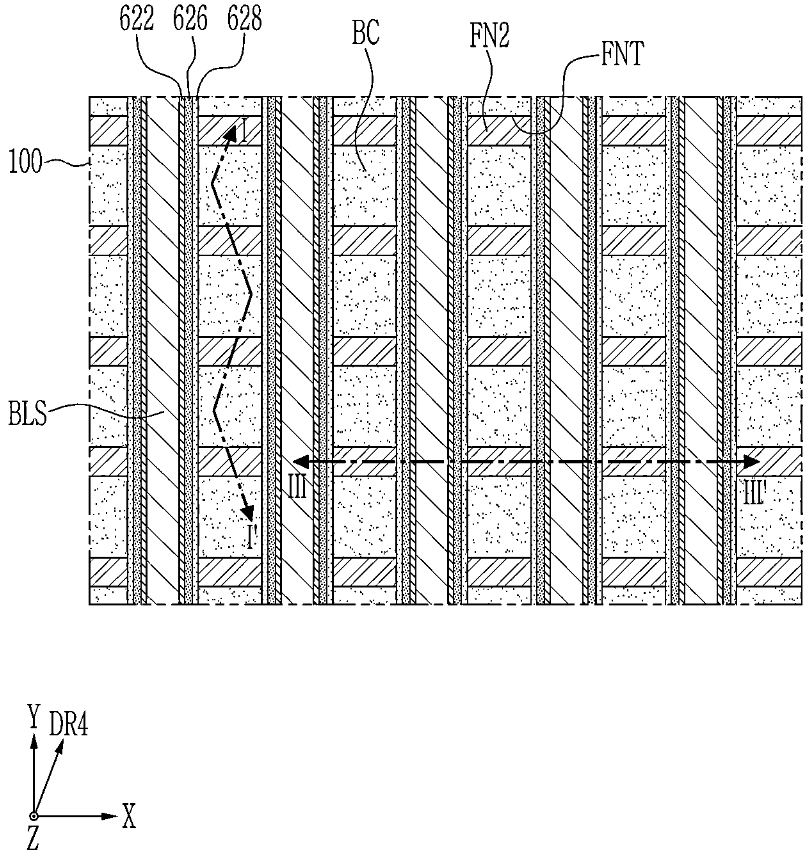
Figure 27:
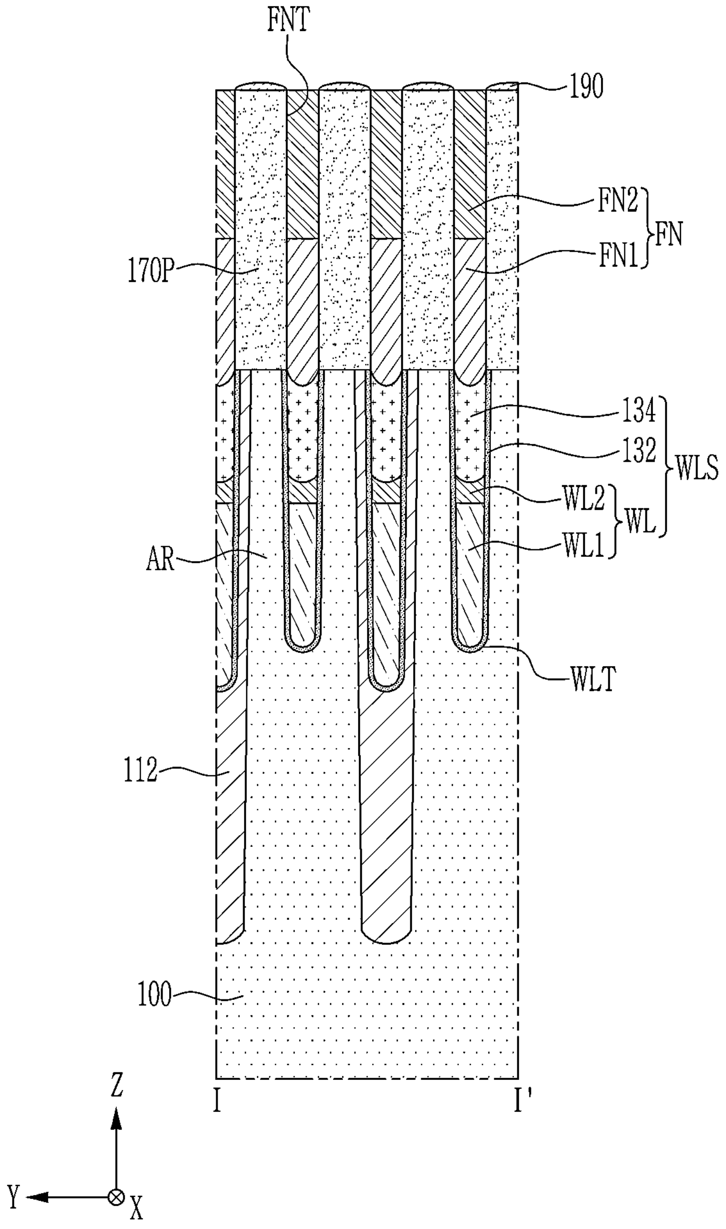
Figure 28:
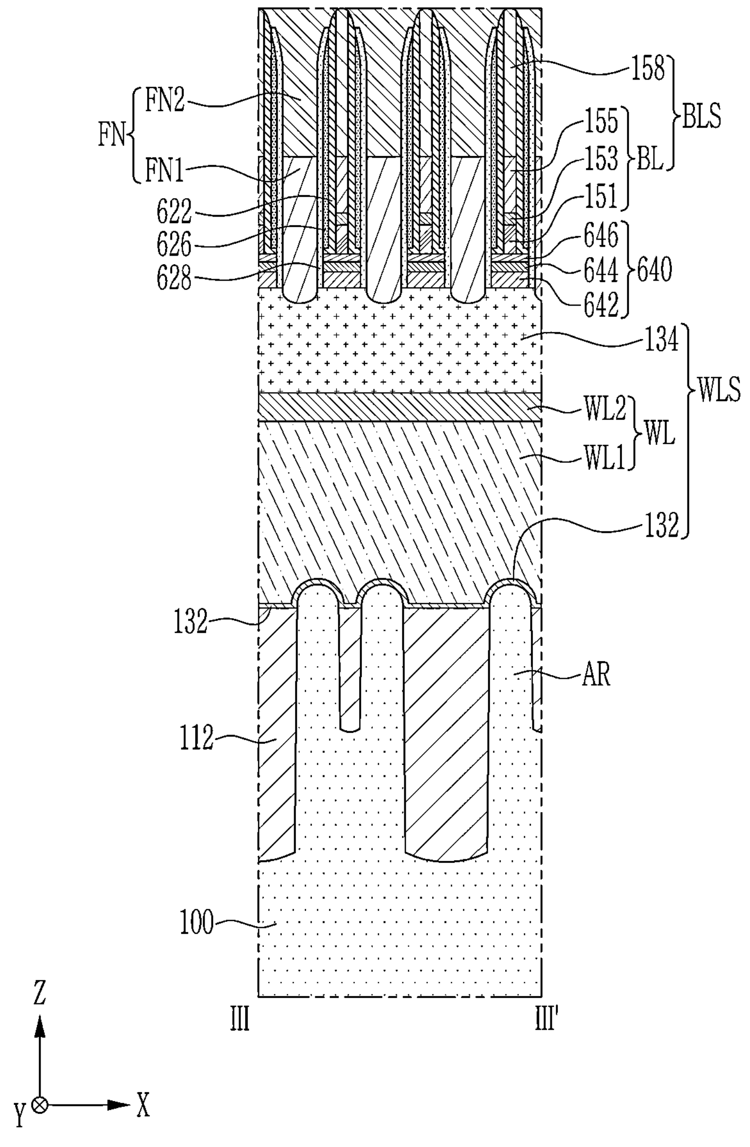

Then, referring to FIGS. 26 to 28, a second fence pattern FN2 may be formed in the fence pattern trench FNT region remaining after the first fence pattern FN1 is formed. Accordingly, the first fence pattern FN1 and the second fence pattern FN2 may configure a fence pattern FN.

The lower surface of the second fence pattern FN2 is directly in contact with the first fence pattern FN1, and a lateral surface of the second fence pattern FN2 may be directly in contact with the conductive material layer 170P. Additionally, the lateral surface of the second fence pattern FN2 may be directly in contact with the spacer structure 620. The top surface of the second fence pattern FN2 may be located at substantially the same level as the top surface of the conductive material layer 170P and the top surface of the bit line structure BLS.

The process operation of forming the second fence pattern FN2 in the fence pattern trench FNT region remaining after the first fence pattern FN1 is formed may include a process operation of forming a second fence pattern material layer on the top surface of the mask pattern 190 and the fence pattern trench FNT region remaining after the first fence pattern FN1 is formed, and then removing a portion of the second fence pattern material layer.

The process operation of removing a portion of the second fence pattern material layer may include an etchback process or a planarization process, such as Chemical Mechanical Polishing (CMP). In addition, in the process operation of removing a portion of the second fence pattern material layer, portions of the mask pattern 190 may be etched together, resulting in a smaller thickness of the mask pattern 190. However, the process for removing the portion of the second fence pattern material layer may be varied.

The second fence pattern material layer may include silicon nitride, silicon nitric oxide, or a combination thereof. However, the second fence pattern material layer is not limited thereto and may be varied.

Figure 29:
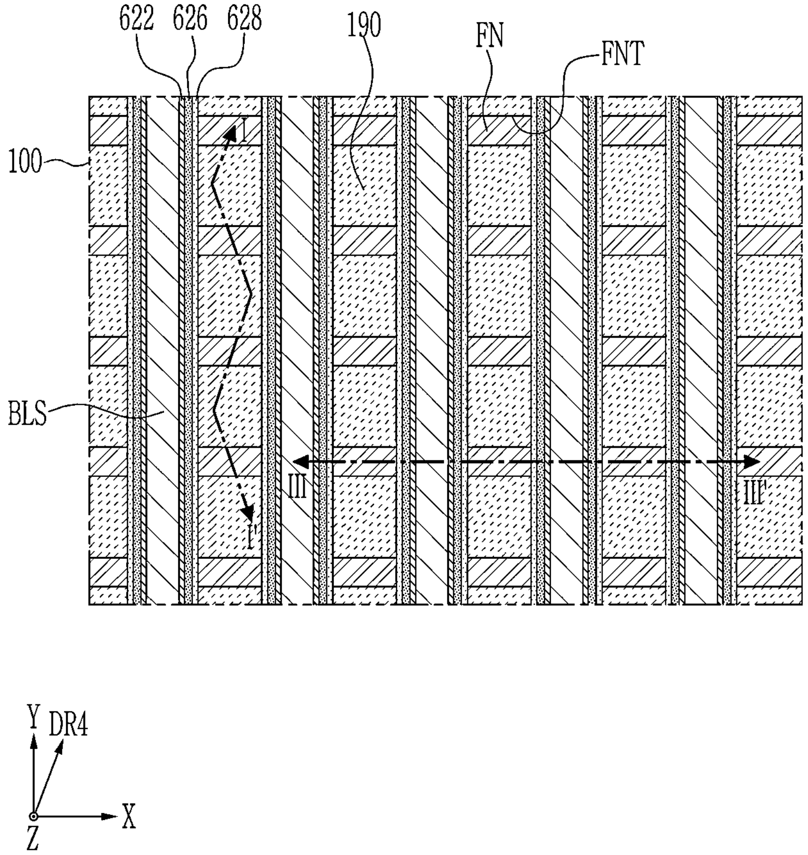
Figure 30:
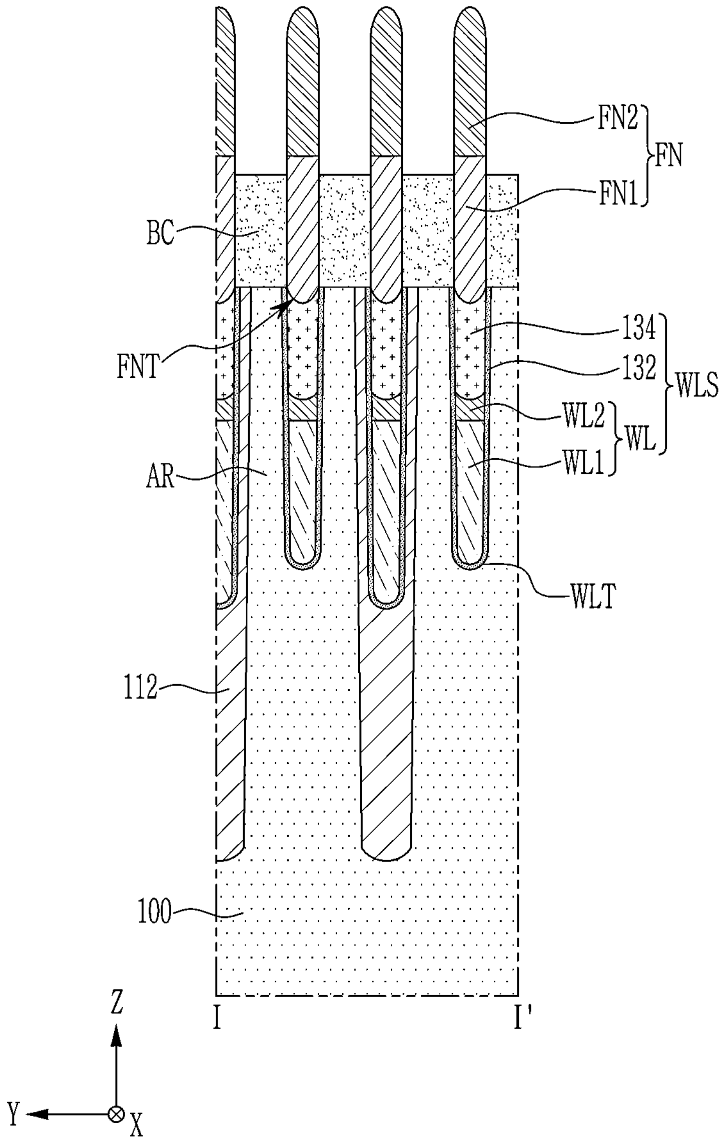

Then, referring to FIGS. 29 and 30, after removing the mask pattern 190, the conductive material layer 170P may be patterned to form a buried contact BC. That is, a buried contact BC may be formed by etching a portion of the conductive material layer 170P located between the fence patterns FN by using the fence pattern FN as a mask.

By etching a portion of the conductive material layer 170P, the remaining conductive material layer 170P may become a buried contact BC. The top surface of the buried contact BC may be located at a lower level than the top surface of the first fence pattern FN1. Furthermore, the fence pattern trench FNT is formed deeper than the thickness of the conductive material layer 170P along the third direction Z, and the fence pattern FN1 is formed within the fence pattern trench FNT, so that the lower surface of the buried contact BC may be located at a higher level than the lower surface of the first fence pattern FN1. However, the arrangement relationship between the top surface and the lower surface of the buried contact BC and the top surface of the first fence pattern FN1 is not limited thereto, and may be varied. For example, the top surface of the buried contact BC and the top surface of the first fence pattern FN1 may be located at substantially the same level. For another example, the top surface of the buried contact BC may be located at a higher level than the top surface of the first fence pattern FN1.

In the process operation of etching the portion of the conductive material layer 170P located between the fence patterns FN by using the fence pattern FN as the mask to form the buried contact BC, a portion of the upper region of the second fence pattern FN2 is removed together, so that the top surface of the second fence pattern FN2 may have a curved shape. However, the shape of the top surface of the second fence pattern FN2 is not limited thereto and may be varied.

Then, referring further to FIGS. 2 and 3 together with FIGS. 29 and 30, a landing pad LP connected with the buried contact BC may be formed, and an insulation pattern 660 separating the landing pads LP may be formed. Although not illustrated, a capacitor structure may be further formed on the landing pad LP.

Although some example embodiments of the present disclosure has been described in detail, the scope of the present disclosure is not limited by the disclosed example embodiments. Various changes and modifications using the inventive concepts of the present disclosure defined in the accompanying claims by those skilled in the art shall be construed to belong to the scope of the present disclosure.

What is claimed is:

1. A semiconductor device, comprising:

a substrate including an active region between device separation layers;

a word line intersecting and overlapping the active region;

a word line capping layer covering a top surface of the word line;

a plurality of bit lines interacting and overlapping the active region and extending in a different direction from an extension direction of the word line;

a plurality of buried contacts each connected to the active region;

a plurality of direct contacts each connecting the active region to a corresponding one of the plurality of bit lines;

a fence pattern on top of the word line capping layer; and a landing pad connected to a corresponding one of the plurality of buried contacts, wherein the fence pattern is within a fence pattern trench, the fence pattern trench being at a corresponding space between the plurality of bit lines and between the plurality of buried contacts, a top surface of the word line capping layer is recessed along a bottom surface of the fence pattern trench, the fence pattern includes a first fence pattern and a second fence pattern on the first fence pattern, the first fence pattern includes a first material, and the second fence pattern includes a second material different from the first material.

2. The semiconductor device of claim 1, wherein:

first permittivity of the first material is different from second permittivity of the second material.

3. The semiconductor device of claim 2, wherein:

each of the plurality of bit lines includes a first conductive layer, a second conductive layer, and a third conductive layer sequentially stacked, and the first fence pattern overlaps at least a portion of each of the first conductive layer, the second conductive layer, and the third conductive layer.

4. The semiconductor device of claim 3, wherein:

the first permittivity of the first material is smaller than the second permittivity of the second material, a top surface of the first fence pattern is at a same level as or at a higher level than a top surface of the third conductive layer, and the second fence pattern does not overlap the third conductive layer.

5. The semiconductor device of claim 3, wherein:

the first permittivity of the first material is smaller than the second permittivity of the second material, a top surface of the first fence pattern is between a top surface of the third conductive layer and a lower surface of the third conductive layer, and the second fence pattern overlaps the third conductive layer.

6. The semiconductor device of claim 3, wherein:

the first permittivity of the first material is greater than the second permittivity of the second material, a top surface of the first fence pattern is at a same level as a lower surface of the third conductive layer or at a lower level than the lower surface of the third conductive layer, and the second fence pattern overlaps the third conductive layer.

7. The semiconductor device of claim 3, wherein:

the first permittivity of the first material is greater than the second permittivity of the second material, a top surface of the first fence pattern is between a top surface of the third conductive layer and a lower surface of the third conductive layer, and the second fence pattern overlaps the third conductive layer.

8. The semiconductor device of claim 3, wherein:

a lower surface of the first fence pattern includes a curved surface, and the lower surface of the first fence pattern is at a lower level than a top surface of the active region.

9. The semiconductor device of claim 1, wherein:

a length ratio of the first fence pattern and the second fence pattern is 1:1.

10. The semiconductor device of claim 9, wherein:

each of a first length of the first fence pattern and a second length of the second fence pattern is 400 Å to 600 Å.

11. The semiconductor device of claim 1, wherein:

the first material includes at least one of $SiO_2$, SiBN, SiCN, or a low dielectric constant (low-k) material, and the second material includes at least one of silicon nitride or silicon nitric oxide.

12. A semiconductor device, comprising:

a substrate including an active region between device separation layers;

a word line intersecting and overlapping the active region;

a word line capping layer covering a top surface of the word line;

a plurality of bit lines interacting and overlapping the active region and extending in a different direction from an extension direction of the word line;

a plurality of buried contacts each connected to the active region;

a plurality of direct contacts each connecting the active region to a corresponding one of the plurality of bit lines;

a fence pattern on top of the word line capping layer; and a landing pad connected to a corresponding one of the plurality of buried contacts, wherein the fence pattern is within a fence pattern trench, the fence pattern trench being at a corresponding space between the plurality of bit lines and between the plurality of buried contacts, a top surface of the word line capping layer is recessed along a bottom surface of the fence pattern trench, the fence pattern includes a first fence pattern, a second fence pattern, and a third fence pattern stacked sequentially within the fence pattern trench, the first fence pattern and the third fence pattern include a first material, the second fence pattern includes a second material having different permittivity from the first material, and at least one of a first length of the first fence pattern, a second length of the second fence pattern, and a third length of the third fence pattern is different.

13. The semiconductor device of claim 12, wherein:

each of the plurality of bit lines includes a first conductive layer, a second conductive layer, and a third conductive layer sequentially stacked, and the second fence pattern overlaps at least a portion of each of the first conductive layer, the second conductive layer, and the third conductive layer.

14. The semiconductor device of claim 13, wherein:

first permittivity of the first material is greater than second permittivity of the second material, the first fence pattern and the third fence pattern do not overlap the first conductive layer, the second conductive layer, and the third conductive layer, and the second fence pattern overlaps the first conductive layer, the second conductive layer, and the third conductive layer.

15. The semiconductor device of claim 13, wherein:

first permittivity of the first material is greater than second permittivity of the second material, the first fence pattern overlaps the first conductive layer and the second conductive layer, the second fence pattern overlaps the third conductive layer, and the third fence pattern does not overlap the first conductive layer, the second conductive layer, and the third conductive layer.

16. A semiconductor device, comprising:

a substrate including an active region between device separation layers;

a word line intersecting and overlapping the active region;

a word line capping layer covering a top surface of the word line;

a plurality of bit lines interacting and overlapping the active region and extending in a different direction from an extension direction of the word line;

a plurality of buried contacts each connected to the active region;

a plurality of direct contacts each connecting the active region to a corresponding one of the plurality of bit lines;

a fence pattern on top of the word line capping layer; and a landing pad connected to a corresponding one of the plurality of buried contacts, wherein the fence pattern is within a fence pattern trench, the fence pattern trench being at a corresponding space between the plurality of bit lines and between the plurality of buried contacts, a top surface of the word line capping layer is recessed along a bottom surface of the fence pattern trench, each of the plurality of bit lines includes a first conductive layer, a second conductive layer, and a third conductive layer stacked sequentially, the fence pattern includes a first fence pattern, a second fence pattern, and a third fence pattern, at least one of the first fence pattern, the second fence pattern, and the third fence pattern includes a different material, and at least one of a first width of the first fence pattern, a second width of the second fence pattern, and a third width of the third fence pattern is different.

17. The semiconductor device of claim 16, wherein:

the first fence pattern is along a first lateral surface of the fence pattern trench, the second fence pattern has a lower surface and a second lateral surface surrounded by the first fence pattern, the third fence pattern is on the first fence pattern and the second fence pattern, the first fence pattern and the third fence pattern include a first material, the second fence pattern includes a second material having lower permittivity than the first material, and the second fence pattern overlaps the first conductive layer, the second conductive layer, and the third conductive layer.

18. The semiconductor device of claim 16, wherein:

the first fence pattern is on the bottom surface of the fence pattern trench, the second fence pattern is along a lateral surface of the fence pattern trench on the first fence pattern, the third fence pattern is on the first fence pattern, and a third lateral surface of the third fence pattern is surrounded by the second fence pattern, the first fence pattern and the second fence pattern include a first material, the third fence pattern includes a second material having lower permittivity than the first material, and the third fence pattern overlaps the third conductive layer.

19. The semiconductor device of claim 16, wherein:

the first fence pattern is along a lateral surface of the fence pattern trench, the second fence pattern has a lower surface and a lateral surface surrounded by the first fence pattern, the third fence pattern is on the first fence pattern and the second fence pattern, the first fence pattern and the third fence pattern include a first material, the second fence pattern includes a second material having higher permittivity than the first material, the first fence pattern and the second fence pattern overlap the first conductive layer and the second conductive layer, and the third fence pattern overlaps the third conductive layer.

20. The semiconductor device of claim 19, further comprising:

a fourth fence pattern located on the third fence pattern and including the second material, wherein the fourth fence pattern does not overlap the first conductive layer, the second conductive layer, and the third conductive layer, a fourth width of the fourth fence pattern is greater than the first width of the first fence pattern and the second width of the second fence pattern, and the fourth width of the fourth fence pattern is same as the third width of the third fence pattern.

* * * * *